US006516722B2

(12) United States Patent
Yamasaki

(10) Patent No.: US 6,516,722 B2
(45) Date of Patent: Feb. 11, 2003

(54) LITHOGRAPHIC PRINTING MACHINE AND LITHOGRAPHIC PRINTING METHOD

(75) Inventor: Sumiaki Yamasaki, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/820,678

(22) Filed: Mar. 30, 2001

(65) Prior Publication Data

US 2002/0100385 A1 Aug. 1, 2002

(30) Foreign Application Priority Data

Mar. 31, 2000 (JP) ....................................... 2000-099048

(51) Int. Cl.$^7$ ............................ B41C 1/10; G03F 7/038

(52) U.S. Cl. ........................ 101/467; 101/456; 101/478; 430/302

(58) Field of Search ................................ 101/456, 457, 101/462, 463.1, 465, 466, 467, 478; 430/302, 270.1

(56) References Cited

U.S. PATENT DOCUMENTS 4,081,572 A * 3/1978 Pacansky .................... 101/467
5,713,287 A * 2/1998 Gelbart ........................ 101/467
5,922,512 A * 7/1999 DoMinh ...................... 101/456
5,996,499 A * 12/1999 Gelbart et al. .............. 101/467
6,159,657 A * 12/2000 Fleming et al. .......... 430/270.1
6,165,691 A * 12/2000 Damme et al. ............. 101/467
6,190,830 B1 * 2/2001 Leon et al. ................. 101/467
6,242,155 B1 * 6/2001 Yamasaki et al. ........ 430/270.1
6,420,083 B1 * 7/2002 Kawamura ............... 101/463.1

FOREIGN PATENT DOCUMENTS

| | | |
|---|---|---|
| JP | 9-99535 | 4/1997 |
| WO | WO99/37481 | 7/1999 |

* cited by examiner

*Primary Examiner*—Stephen R. Funk
(74) *Attorney, Agent, or Firm*—Burns, Doane, Swecker & Mathis, LLP

(57) ABSTRACT

Provided is a lithographic printing machine comprising a plate cylinder for imaging, a blanket cylinder, an impression cylinder, and a film-coating unit, a film-hardening unit, an imaging unit and a cleaning unit each unit of which is adjacent to the plate cylinder for imaging, wherein an image-forming layer containing a polymer having a functional group which is crosslinked by light or heat before imaging and a functional group which is converted from hydrophilic to hydrophobic by the heat generated by infrared ray irradiation is formed by the coating unit. A lithographic printing method using the lithographic printing machine is also provided.

10 Claims, 1 Drawing Sheet

LITHOGRAPHIC PRINTING MACHINE AND LITHOGRAPHIC PRINTING METHOD

FIELD OF THE INVENTION

Figure 1:
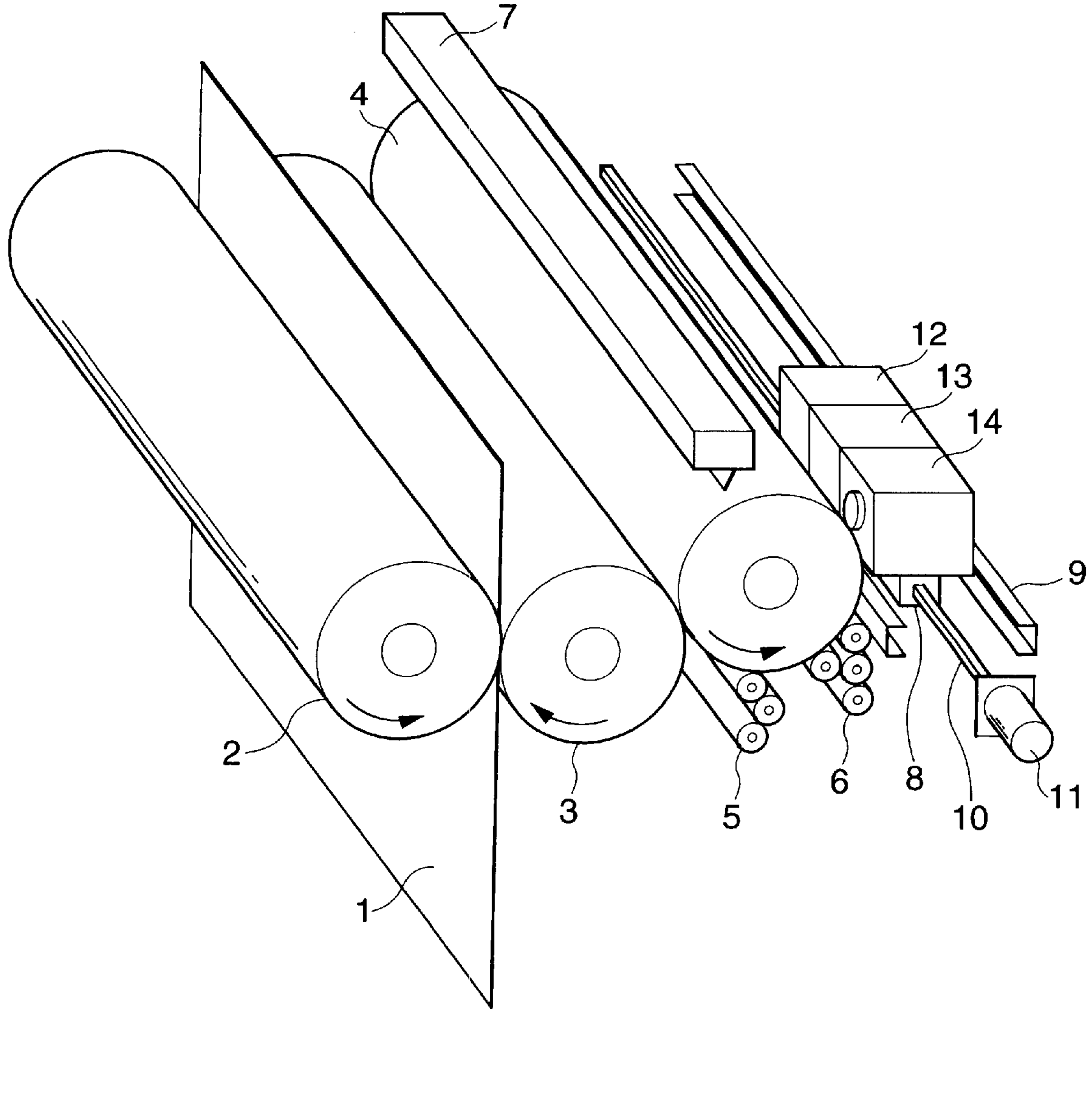

The present invention relates to a lithographic printing machine and a lithographic printing method. More specifically, the present invention relates to a lithographic printing machine capable of forming an image-forming layer on a plate cylinder for imaging of the lithographic printing machine, forming an image pattern on the image-forming layer by scanning exposure of an image by laser beams on the basis of digital data, making a printing plate, and capable of effecting printing excellent in resistance against scumming with the same printing plate on the same printing machine, and relates to a method of lithographic printing.

BACKGROUND OF THE INVENTION

Lithographic printing is a method of effecting printing by making use of an ink-receptive lipophilic area and an ink-nonreceptive hydrophilic or lipophobic area, and photosensitive lithographic printing plate precursors (PS plates) are now widely used as printing plate materials.

PS plates comprising a metal support such as an aluminum plate having been subjected to surface-graining treatment, anodizing treatment and hydrophilization treatment having provided thereon a photosensitive layer comprising a photosensitive diazo resin, a photopolymerizable composition, a photo-crosslinkable composition, etc., have been put to practical use and are prevailingly used. The photosensitive layer of the nonimage area of these PS plates is removed by image exposure and development, and printing is performed by making use of the hydrophilicity of the support surface and the lipophilicity of the photosensitive layer of the image area.

Further, so-called direct plate-making of directly making an offset printing plate from the original without using a film for plate-making is going into the field of general offset printing by making use of characteristics such as simplicity requiring no skill, labor saving, rapidity capable of expediting plate-making, etc. In particular, in recent years, various printing plate materials of novel types have been developed conjointly with the rapid progress of output systems, e.g., a pre-press system, an image setter, a laser printer, etc.

These printing plate materials have the possibilities of application to so called plate-making on machine, i.e., plate-making by installing these printing plate materials on the plate cylinder of a printing machine and imagewise irradiating them with laser beams to make a printing plate. However, direct plate-making which requires development process with a developing solution is not good for plate-making on machine.

As the printing plate precursor which requires no development process, there is disclosed in WO 99/37481 an ablation type positive lithographic printing plate precursor capable of recording by laser, which comprises a support having provided thereon a crosslinked hydrophilic layer, and thereon an ink-receptive surface layer of an organic polymer layer which contains one or more polymers and light/heat converting dyes capable of absorbing radiation of lasers, and the polymer layer absorbs radiation by ablation.

Furthermore, as the trend of plate-making, direct plate-making on the same printing machine as that for printing work by the above-described lithographic printing machine of direct imaging on printing machine is proposed. For example, it is suggested in JP-A-9-99535 (the term "JP-A" as used herein means an "unexamined published Japanese patent application") to use a seamless cylinder (hence there is no space or groove) in place of plate cylinders so far been used for offset printing, cure a curable polymer coated on the seamless cylinder, and convert the affinity to a printing ink of the surface of the polymer by selectively irradiating the polymer surface with a laser. Since only the surface of the polymer is selectively converted by laser irradiation, the thickness and the uniformity of the polymer coating matter little. A plate cylinder is cleaned after one printing work is finished. There is described in the patent specification that the cleaning need not be perfect because the surface of a plate cylinder itself is not exposed to ink.

Such direct plate-making on printing machine has been developed for the purpose of providing a reusable surface layer which does not necessitate perfect cleaning of coating by the method of tolerating the remaining coating on the plate cylinder for imaging after cleaning and shortening the time required to make an image again, hence the method has the advantage of heat mode plate-making and printing method. However, with respect to heat mode sensitivity to irradiated laser rays, the above technique is not sufficient yet and, from the viewpoint of practical use, it has further been desired to achieve higher sensitization, to thereby increase a discriminating effect of an image area and a nonimage area (a discriminating property of hydrophobic property/hydrophilic property before and after exposure), and a method of direct plate-making on machine providing printed matters with no scumming.

SUMMARY OF THE INVENTION

Accordingly, an object of the present invention is to provide a lithographic printing machine which makes it possible to directly form an image and make a printing plate on machine, to sufficiently maintain the discrimination of an image area and a nonimage area, and to provide printed matters without generating scumming even under severe printing conditions. Another object is to provide a lithographic printing method.

As a result of eager investigations for achieving the above objects, the present inventors have found that printed matters generating no scumming even under severe printing conditions can be obtained using a polymer having a functional group which is converted from hydrophilic to hydrophobic by heating or by the heat generated by light/heat conversion as the heat-sensitive material for forming the image-forming layer (which is also referred to as a radiation-sensitive layer sometimes) on a lithographic printing machine equipped with a plate cylinder for imaging. Thus, the present invention has been achieved.

That is, the present invention is as follows.

(1) A lithographic printing machine comprising a plate cylinder for imaging, a blanket cylinder, an impression cylinder, and a film-coating unit, a film-hardening unit, an imaging unit and a cleaning unit each unit of which is adjacent to the plate cylinder for imaging, wherein an image-forming layer containing a polymer having a functional group which is crosslinked by light or heat before imaging and a functional group which is converted from hydrophilic to hydrophobic by the heat generated by infrared ray irradiation is formed by the coating unit.

(2) A lithographic printing method on a lithographic printing machine comprising a plate cylinder for imaging, a blanket cylinder, an impression cylinder, and a film-coating unit, a film-hardening unit, an imaging unit and a cleaning unit each unit of which is adjacent to the plate cylinder for imaging, which comprises the steps of at least (a) cleaning operation of cleaning said plate cylinder for imaging, (b) coating operation of coating an image-forming layer containing a polymer having a functional group converting from hydrophilic to hydrophobic by heating on the surface of said plate cylinder for imaging, (c) hardening operation of hardening said image-forming layer to a solid state, and (d) surface conversion operation of forming an image pattern due to hydrophilic/hydrophobic conversion corresponding to the digital data to be printed on the surface of said image-forming layer.

According to the present invention, a printing plate can be made directly from digital data by the process comprising the steps of forming, as a radiation-sensitive material, a thin layer of a polymer having a functional group converting from hydrophilic to hydrophobic by heating or by the heat generated by light/heat conversion on the surface of the plate cylinder for imaging of a printing machine by means of a film-coating unit and a film-hardening unit each unit of which is adjacent to the plate cylinder, and recording with a thermal head or a laser radiating infrared rays equipped in the imaging unit.

The radiation-sensitive layer according to the present invention largely converts from hydrophilic to hydrophobic to exhibit polarity conversion by scanning exposure of an image with laser beams in short time. As a result, the discrimination against inks occurs and an image area and a nonimage area are formed, thus a printing plate capable of providing printed matters not generating scumming can be made directly on machine without requiring special processes such as wet development or rubbing after image exposure even under severe printing conditions.

In general, special care should be taken in film hardening about the storage stability after coating of radiation-sensitive materials, but in the present invention it is not necessary to give care to the storage stability, since hardening treatment can be performed immediately after direct coating on machine, thus the radiation-sensitive material of the present invention is suitable to direct plate-making on machine.

BRIEF DESCRIPTION OF ACCOMPANYING DRAWING

FIG. 1 is a perspective view showing a lithographic printing machine capable of direct imaging and plate-making on machine of the present invention.

DETAILED DESCRIPTION OF THE INVENTION

A lithographic printing machine capable of imaging and plate-making on machine according to the present invention and a plate-making method will be described in detail below.

A printing unit of a lithographic printing machine according to the present invention will be described with referring to FIG. 1. FIG. 1 is a perspective view showing an example of an apparatus for direct imaging and plate-making on machine of the present invention. Printing paper 1 in sheet or web (hereinafter referred to as merely "paper") is inserted between impression cylinder 2 and blanket cylinder 3. Blanket cylinder 3 is in contact with imaging plate cylinder 4 taking the place of plate cylinder in ordinarily used printing machine, and functions as a means of transferring an ink-adhered image described later from imaging plate cylinder 4 to paper 1. The primary difference between imaging plate cylinder 4 and an ordinarily used plate cylinder (not shown in the figure) is that imaging plate cylinder 4 is a seamless cylinder. Therefore, as compared with an ordinarily used plate cylinder (not shown in the figure) having a long and narrow space to clamp a printing plate, seamless imaging plate cylinder 4 is not accompanied by vibration and can operate at higher speed. The film of a radiation-sensitive material having a functional group for image-forming described later coated on the peripheral surface of imaging plate cylinder 4 is adhered with an ink by water/ink-supplying system comprising ink fountain roller 5 and form roller 6. Ink fountain roller 5 and form roller 6 are integrated in a kind of ink-supplying system called "integrated" ink-supplying chain. In other method, the printing machine can be operated on water-free offset mode (or called "dry offset") without using ink fountain roller 5. The mechanism of the printing machine described above is conventionally well known.

Cleaning (washing) unit 7 is equipped in close vicinity to imaging plate cylinder 4. Cleaning unit 7 is to wipe off the ink, water and almost all the image-drawn radiation-sensitive layer on imaging plate cylinder 4 used in the previous printing work. Cleaning unit 7 is analogous to well-known "blanket washer" which is used in a modern printing machine for cleaning a blanket cylinder between one printing work and the next printing work, but differs in that sometimes a special solvent has to be added to cleaning unit 7 to dissolve almost all the image-drawn radiation-sensitive layer on the plate cylinder for imaging. According to the design of a modern printing machine, additional cleaning units can be equipped for cleaning a blanket cylinder and other cylinders.

Straight rail 9 is fixed in parallel to imaging plate cylinder 4, and carriage 8 is equipped which transfers to right and left along imaging plate cylinder 4 by the control of motor 11 and master screw 10 on straight rail 9. The movements of imaging plate cylinder 4 and motor 11 are synchronized by means of a shaft encoder in an analogous mode to a drum type imaging unit.

Since a drum type imaging unit is well-known and on the market for long, the details of the synchronization and processing of image data (hereinafter sometimes referred to as merely "data") are not described furthermore. Coating unit 12, hardening unit 13 and imaging unit 14 are equipped on carriage 8, and they are contrived to transfer to right and left along the overall width of imaging plate cylinder 4 together with carriage 8.

As described above, coating unit 12 sprays a polymer compound solution (a liquid polymer) of the radiation-sensitive material on imaging plate cylinder 4 after imaging plate cylinder 4 is cleaned (washed) by cleaning unit 7. Alternatively, such a polymer can be coated on imaging plate cylinder 4 by means of a roller as ink-coating.

Since an image should be drawn on the surface of the polymer coating within a short period of time after coating the polymer (generally less than 1 minute), the hardening of the liquid polymer to a solid state should be accelerated. The hardening of the polymer is accelerated by radiation or a hot blast generated by hardening unit 13. It is possible to use ultraviolet rays to accelerate hardening, but the hardening by ultraviolet rays is not so desired, since it generates a crosslinked polymer which is difficult to be cleaned by cleaning unit 7. A radiation-sensitive layer is coated on imaging plate cylinder 4 in a thickness of generally from 1 to 10 $\mu$m. Hence, the amount of a polymer material to be hardened is small, thus the quantity of energy required in rapid hardening can be saved.

After polymer hardening, an image pattern (hereinafter sometimes referred to as merely "image" or "pattern")

comprising an ink-receiving domain (hydrophobic) and an ink-repelling domain (hydrophilic) is formed on the surface of the hardened polymer by means of, e.g., imaging head 14 comprising multichannel laser heads. A plurality of laser beams and relatively high power are required to draw images throughout the surface of the polymer in short time (within one or two minutes). A multi-beam laser imaging unit such as multichannel laser head 14 is well known. The laser array disclosed in U.S. Pat. No. 4,743,091 is an example of such multichannel laser heads. The required number of laser beams (hereinafter sometimes referred to as merely "beams") depends upon the necessary imaging time, the power of laser and the maximum engine speed of imaging plate cylinder 4.

During cleaning (washing and wiping), coating and imaging, the printing machine is on "printing operation off" mode (actuation mode of not operating printing). That is, imaging plate cylinder 4 is out of contact with any other cylinders during printing operation off mode (the same as the plate cylinders of usually used offset or lithographic printing machines on printing operation off mode). When the imaging by imaging unit 14 is finished, the printing machine is switched from printing operation off mode to printing operation on mode (actuation mode of operating printing), and an ink is adhered to the surface of the image-drawn radiation-sensitive layer (image-forming layer) on imaging plate cylinder 4 on usual offset mode or water-free offset mode.

Materials which are hydrophilic and suitable as the materials of seamless imaging plate cylinder 4 include Alumite, chromium, nickel, steel and alumina ($Al_2O_3$), and ceramics such as zirconia ($ZrO_2$). Zirconia is particularly preferred because it has high durability, is hydrophilic, fireproof, and is furthermore low in heat conductivity. If heat conductivity is low, the quantity of laser energy required to heat polymer coating to induce chemical conversion of radiation-sensitive layer can be saved. Since the converted polymer area is hydrophilic and the surface of imaging plate cylinder 4 is also hydrophilic, the printing property is scarcely affected even when radiation-sensitive layer is abraded.

Radiation-Sensitive Layer (Image-forming Layer)

In the next place, a radiation-sensitive layer formed by coating on an imaging plate cylinder is described below. A radiation-sensitive material (a heat-sensitive image-forming material) of the present invention for use in a plate-making method by a printing machine capable of direct imaging and plate-making on machine is not particularly restricted so long as the material contains a polymer having the functional group which is converted from hydrophilic to hydrophobic by heating.

The present invention is characterized in that the above-described radiation-sensitive material is used as the image-forming material on the imaging plate cylinder of a printing machine capable of direct imaging and plate-making on machine.

Description of Polymer Having Functional Group (a) Which is Converted from Hydrophilic to Hydrophobic by Heating Specific examples of the functional groups which are converted from hydrophilic to hydrophobic by heating include at least one functional group selected from a carboxylic acid group, a carboxylate group, a sulfonic acid group, and a phosphonic acid group. The carboxylic acid group, carboxylate group, sulfonic acid group, and phosphonic acid group are represented by the following formulae (1), (2), (3) and (4) respectively, preferably a carboxylic acid group, a carboxylate group, and a sulfonic acid group represented by formulae (1) (2) and (3) respectively, and particularly preferably a carboxylate group represented by formula (2).

(1)

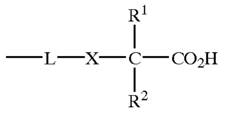

(2)

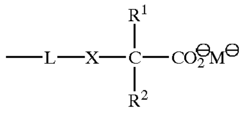

(3)

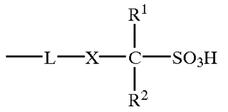

(4)

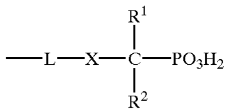

wherein X is selected from —CO—, —SO—, —$SO_2$—, and elements belonging to Group 15 and Group 16 of the Periodic Table; —L— represents a divalent connecting group; $R^1$ and $R^2$, which may be the same or different, each represents a monovalent group; and M represents a cation selected from the group consisting of an alkali metal, an alkaline earth metal and onium.

$R^1$ and $R^2$ each represents a monovalent nonmetallic atomic group containing a hydrogen atom, and preferred examples include a halogen atom (e.g., —F, —Br, —Cl, —I), a hydroxyl group, an alkyl group, an alkoxyl group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3$H) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonoxy group ($—OPO_3H_2$) and a conjugate base group thereof (hereinafter referred to as a phosphonatoxy group), a dialkylphosphonoxy group ($—OPO_3(alkyl)_2$), a diarylphosphonoxy group ($—OPO_3(aryl)_2$), an alkylarylphosphonoxy group ($—OPO_3(alkyl)(aryl)$), a monoalkylphosphonoxy group ($—OPO_3H(alkyl)$) and a conjugate base group thereof (hereinafter referred to as an alkylphosphonatoxy group), a monoarylphosphonoxy group ($—OPO_3H(aryl)$) and a conjugate base group thereof (hereinafter referred to as an arylphosphonatoxy group) a cyano group, a nitro group, an aryl group, an alkenyl group, and an alkynyl group.

Preferred examples of the alkyl groups are straight chain, branched or cyclic alkyl groups having from 1 to 20 carbon atoms each of which may have a substituent, and specific examples include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these groups, a straight chain alkyl group having from 1 to 12 carbon atoms, a branched alkyl group having from 3 to 12 carbon atoms, and a cyclic alkyl group having from 5 to 10 carbon atoms are more preferred.

Examples of the substituents of the substituted alkyl groups are monovalent nonmetallic atomic groups exclusive of a hydrogen atom, and preferred examples include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonoxy group ($—OPO_3H_2$) and a conjugate base group thereof (hereinafter referred to as a phosphonatoxy group), a dialkylphosphonoxy group ($—OPO_3(alkyl)_2$), a diarylphosphonoxy group ($—OPO_3(aryl)_2$), an alkylarylphosphonoxy group ($—OPO_3(alkyl)(aryl)$), a monoalkylphosphonoxy group ($—OPO_3H(alkyl)$) and a conjugate base group thereof (hereinafter referred to as an alkylphosphonatoxy group), a monoarylphosphonoxy group ($—OPO_3H(aryl)$) and a conjugate base group thereof (hereinafter referred to as an arylphosphonatoxy group) a cyano group, a nitro group, an aryl group, an alkenyl group, and an alkynyl group.

As the specific examples of the alkyl groups in these substituents, the above-described alkyl groups can be exemplified, and as the specific examples of the aryl groups in these substituents, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group can be exemplified. As the examples of the alkenyl groups in these substituents, a vinyl group, a 1-propenyl group, a 1-butenyl group, a cinnamyl group, and a 2-chloro-1-ethenyl group can be exemplified. As the examples of the alkynyl groups, an ethynyl group, a 1-propynyl group, a 1-butynyl group and a trimethylsilylethynyl group can be exemplified. As $G^1$ in the acyl group ($G^1CO$—), a hydrogen atom and the above-described alkyl groups and aryl groups can be exemplified. Of these substituents, more preferred groups include a halogen atom (—F, —Br, —Cl, —I) an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

On the other hand, as the alkylene groups in the substituted alkyl groups, the alkylene groups obtained by removing any one hydrogen atom on the above-described alkyl groups having from 1 to 20 carbon atoms to make divalent organic residues can be exemplified, preferably a straight chain alkylene group having from 1 to 12 carbon atoms, a branched alkylene group having from 3 to 12 carbon atoms, and a cyclic alkylene group having from 5 to 10 carbon atoms. Specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R^1$ and $R^2$ each represents an aryl group, the aryl groups include a condensed ring formed by 1 to 3 benzene rings and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Of these groups, a phenyl group and a naphthyl group are more preferred. Heterocyclic aryl groups are included in the aryl group besides the above carbocyclic aryl groups. As the heterocyclic aryl groups, a pyridyl group, a furyl group, those containing from 3 to 20 carbon atoms and from 1 to 5 hetero atoms, e.g., a quinolyl group, a benzofuryl group, a thioxanthone group, and a carbazole group condensed with a benzene ring are used.

As the substituted aryl groups, those having, as the substituents, monovalent nonmetallic atomic groups exclusive of a hydrogen atom on the ring-forming carbon atoms of the above-described aryl groups are used. As preferred examples of the substituents, the above-described alkyl groups, the substituted alkyl groups, and the groups described above as the examples of the substituents for the substituted alkyl groups can be exemplified. Preferred specific examples of such substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

Specific preferred examples represented by X include —O—, —S—, —Se—, —CO—, —SO—, and —$SO_2$—, and —CO—, —SO— and —$SO_2$— are particularly preferred of these in view of heat reactivity.

The divalent connecting group represented by L is preferably a group composed of nonmetallic atoms selected from from 1 to 60 carbon atoms, from 0 to 10 nitrogen atoms, from 0 to 50 oxygen atoms, from 1 to 100 hydrogen atoms, and from 0 to 20 sulfur atoms. As more specific examples of the connecting groups, those comprised of the following structural units in combination can be exemplified.

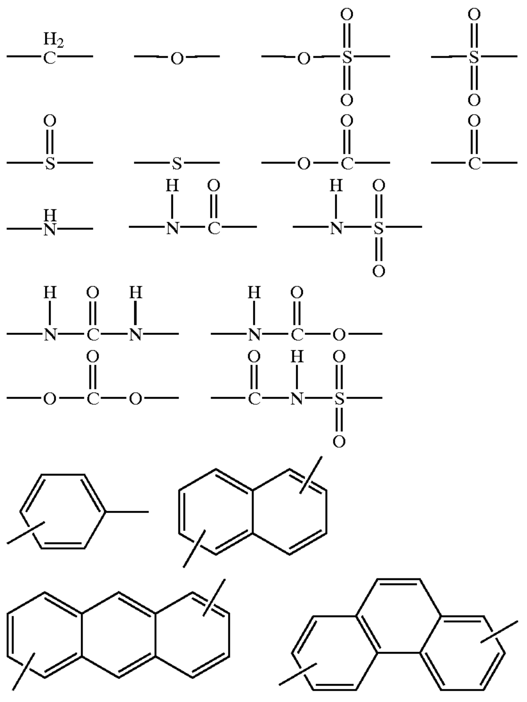

M is not particularly restricted so long as it represents a cation but it is preferably a monovalent to tetravalent metal cation or an ammonium salt represented by the following formula (5):

(5)

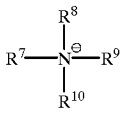

wherein $R^7$, $R^8$, $R^9$ and $R^{10}$, which may be the same or different, each represents a monovalent group.

The monovalent to tetravalent metal cation represented by M is selected from $Li^+$, $Na^+$, $K^+$, $Rb^+$, $Cs^+$, $Be^{2+}$, $Mg^{2+}$, $Ca^{2+}$, —$Sr^{2+}$, $Ba^{2+}$, $Ra^{2+}$, $Cu^+$, $Cu^{2+}$, $Ag^+$, $Zn^{2+}$, $Al^{3+}$, $Fe^{2+}$, $Fe^{3+}$, $Co^{2+}$, $Ni^{2+}$, $Ti^{4+}$ and $Zr^{4+}$, more preferably $Li^+$, $Na^+$, $K^+$, $Rb^+$, $Cs^+$, $Fr^+$, $Cu^+$ and $Ag^+$.

In the ammonium ion represented by formula (5), specific examples of the groups represented by $R^7$, $R^8$, $R^9$ and $R^{10}$ are the same as the groups represented by $R^1$ and $R^2$ described above. Specific examples of the ammonium ions represented by formula (5) are shown below.

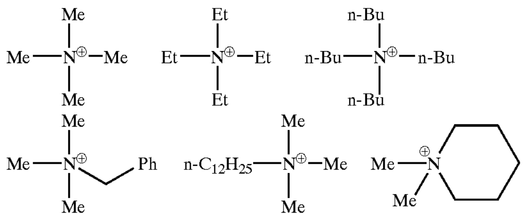

-continued

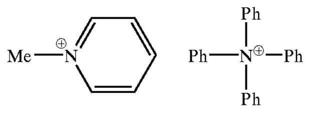

Specific examples of the functional groups represented by formulae (1) to (4) are shown below, but the present invention is not limited thereto.

(1)

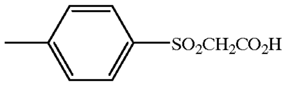

(2)

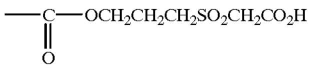

(3)

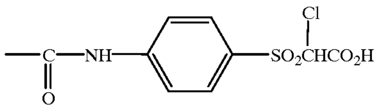

(4)

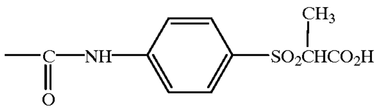

(5)

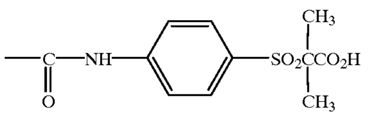

(6)

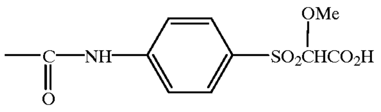

(7)

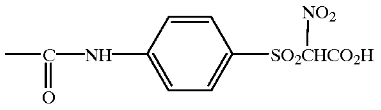

(8)

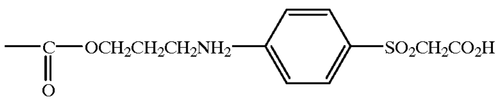

(9)

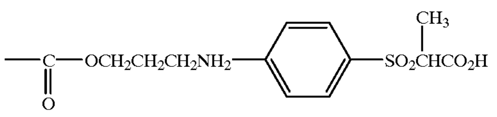

(10)

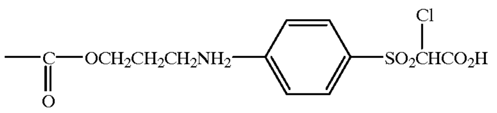

-continued (11)

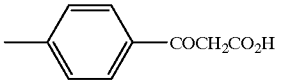

(12)

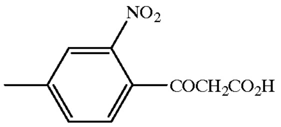

(13)

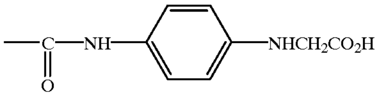

(14)

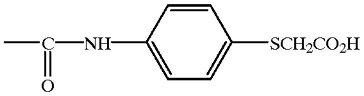

(15)

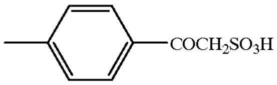

(16)

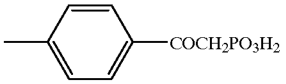

(17)

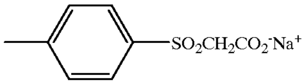

(18)

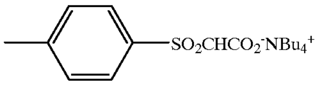

(19)

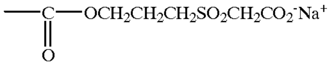

(20)

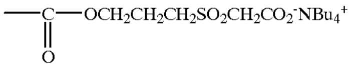

(21)

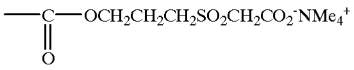

(22)

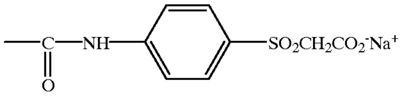

(23)

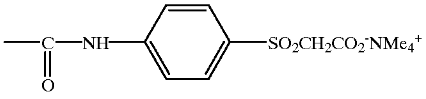

(24)

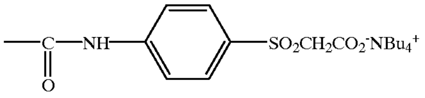

-continued (25)

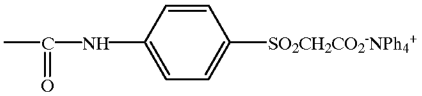

(26)

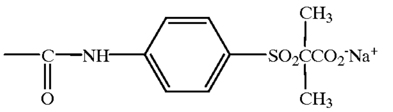

(27)

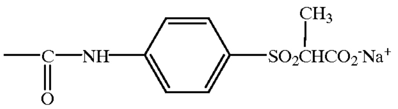

(28)

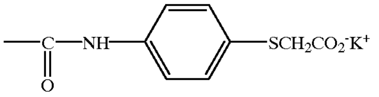

(29)

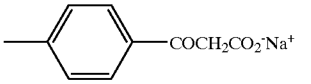

(30)

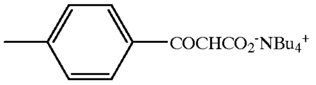

Crosslinking methods for preparing polymers three dimensionally crosslinked and having the above-described functional group (a) which polymers are to be contained in a recording layer of the lithographic printing plate precursor used in the present invention are not particularly restricted, and polymers obtained by a sol/gel reaction, photo-crosslinking reaction, and thermal-crosslinking reaction can be used, for instance.

Polymers obtained by a sol/gel reaction are described below.

A polymer obtained by a sol/gel reaction is a reaction product of (i) a compound having, in the same molecule, functional group (a), and (b) at least any functional group selected from the group consisting of —OH, —$NH_2$, —NH—CO—$R^3$, and —$Si(OR^4)_3$ (wherein $R^3$ and $R^4$ each represents an alkyl group or an aryl group, and when $R^3$ and $R^4$ are both contained in the compound containing these functional groups, they may be the same or different), with (ii) a polymerizable compound by hydrolysis represented by the following formula (6):

$$(R^5)_n—X^1—(OR^6)_{4-n} \quad (6)$$

wherein $R^5$ and $R^6$, which may be the same or different, each represents an alkyl group or an aryl group; $X^1$ represents Si, Al, Ti or Zr; and n represents 0, 1 or 2.

In the above compound (i), functional group (a) whose hydrophilic property is converted by decarbonization by at least radiation irradiation or by heat carries the image signal-responding function and records images as image signals in the molecule in the form of conversion to hydrophobic by responding to at least either directly radiation or heat. On the other hand, functional group (b) present in the same molecule has the function of bonding compound (i) to the peripheral matrix. Specifically, functional group (b)

reacts with at least any of (ii) a hydrolysis polymerizable compound represented by formula (6) or the hydrolyzed product thereof, and hydrolysis polymerizable compound (ii) is polymerized by hydrolysis, thereby an image-recording matrix consisting of bonding chains of an inorganic compound is formed in the film and crosslinked, thus an image recorded is strengthened.

Functional group (b) in compound (i) is a group carrying the function of bonding compound (i) to the matrix of compound (ii), and any well-known functional groups can be used as functional group (b) so long as they have the property of reacting with the alkyl group, aryl group, alkoxyl group, or aryloxy group in compound (ii), or the hydroxyl group by hydrolysis or central metallic atoms to form bonding, and can coexist with functional group (a) in the same molecule. A functional group forming bonding by the reaction with a hydroxyl group or an alkoxyl group is particularly preferred. Of these, a functional group selected from the group consisting of —OH, $—NH_2$, —NH—CO—$R^3$, and $—Si(OR^4)_3$ (wherein $R^3$ and $R^4$ each represents an alkyl group or an aryl group, and when $R^3$ and $R^4$ are both contained in the compound containing these functional groups, they may be the same or different) is preferably used in the present invention.

When functional group (b) represents —NH—CO—$R^3$ and/or $—Si(OR^4)_3$, $R^3$ and $R^4$ each preferably represents an alkyl group having from 1 to 10 carbon atoms or an aryl group having from 6 to 20 carbon atoms, and they may be substituted with a halogen atom such as chlorine, an alkoxyl group such as a methoxy group or an alkoxycarbonyl group such as a methoxycarbonyl group. As the specific examples of —NH—CO—$R^3$, —NH—CO—$CH_3$ and —NH—CO—$C_2H_5$ can be exemplified, and as the specific examples of $—Si(OR^4)_3$, $—Si(OCH_3)_3$ and $—Si(OC_2H_5)_3$ can be exemplified.

The synthesis method of compound (i) is not particularly restricted, and compound (i) can be obtained by radical polymerization of a monomer having functional group (a) and a monomer having functional group (b). As such compound (i), copolymers comprising one kind of monomer having functional group (a) and one kind of monomer having functional group (b) may be used, but copolymers in which both monomers comprise two or more kinds or either one monomer comprises two or more kinds, or copolymers comprising these monomers and other monomers can be used.

Specific examples of the monomers having a functional group represented by the above-described formula (1), (2), (3) or (4) which are preferably used in the synthesis of compound (i) are shown below, but the present invention is not limited thereto.

(1)

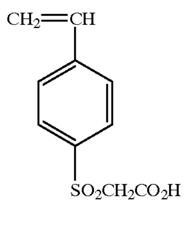

-continued (2)

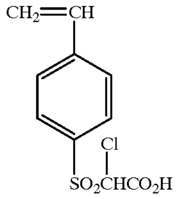

(3)

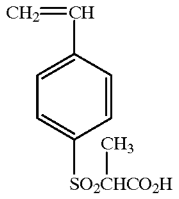

(4)

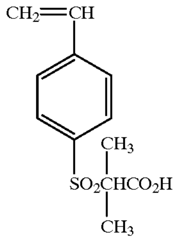

(5)

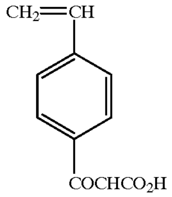

(6)

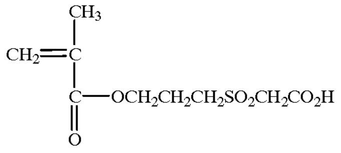

(7)

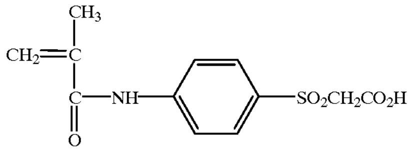

(8)

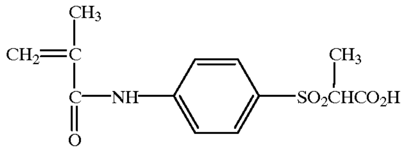

-continued
(9)
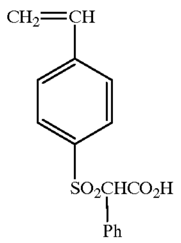
(10)
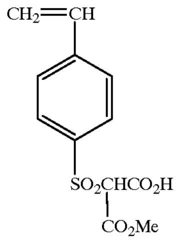
(11)
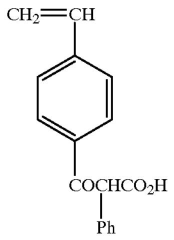
(12)
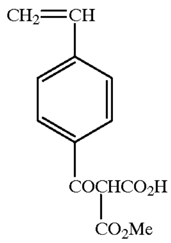
(13)
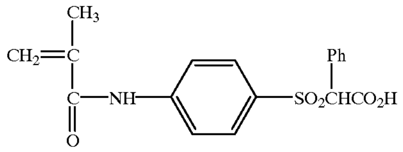
(14)
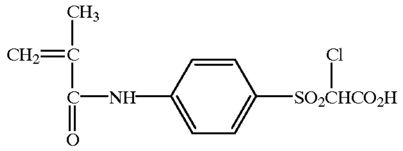
(15)
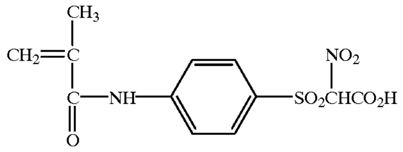
-continued
(16)
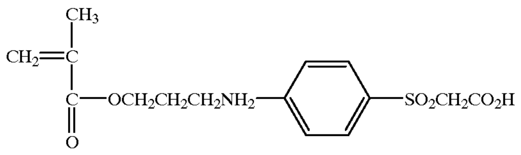
(17)
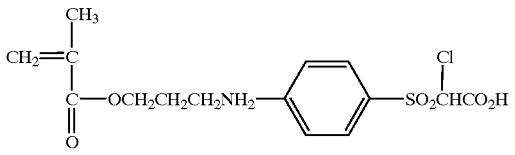
(18)
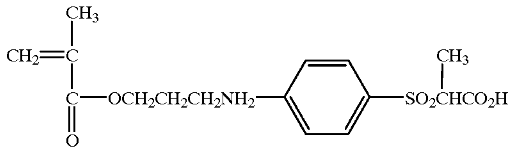
(19)
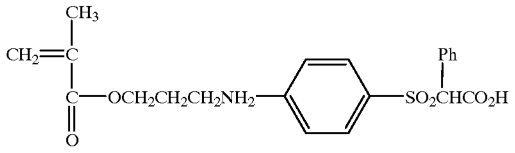
(20)
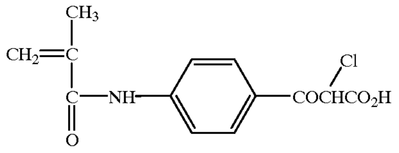
(21)
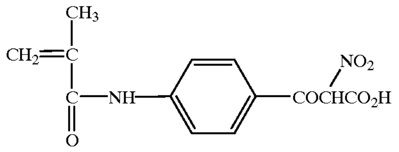
(22)
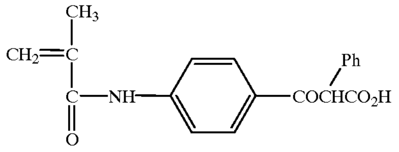
(23)
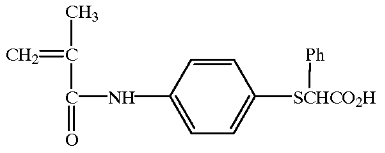
(24)
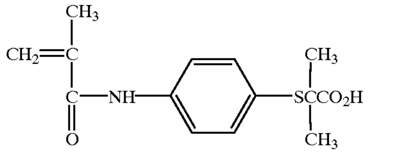

-continued
(25)
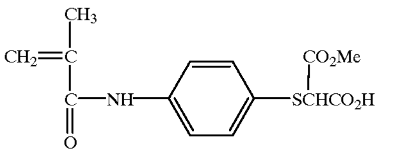
(26)
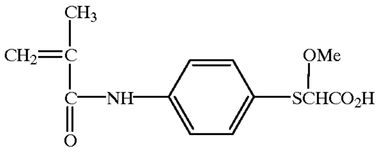
(27)
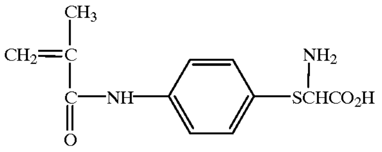
(28)
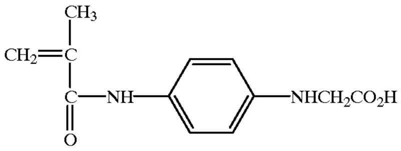
(29)
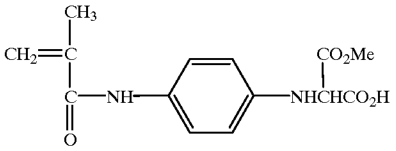
(30)
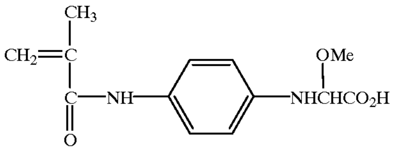
(31)
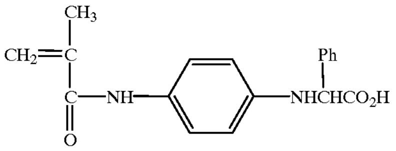
(32)
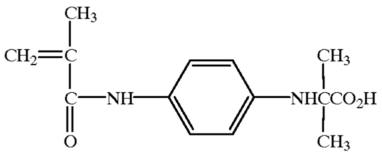
(33)
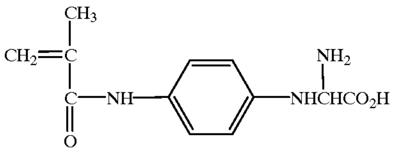
-continued
(34)
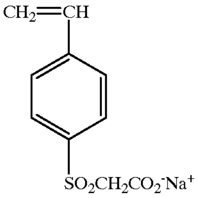
(35)
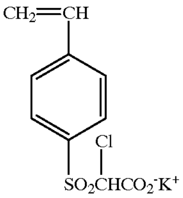
(36)
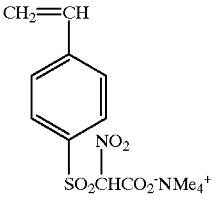
(37)
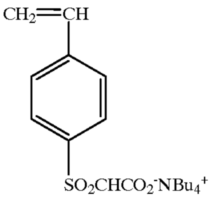
(38)
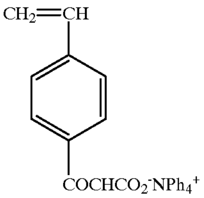
(39)
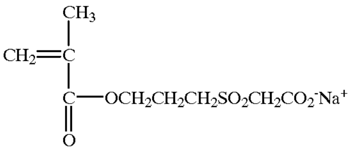
(40)
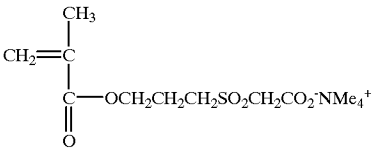
(41)
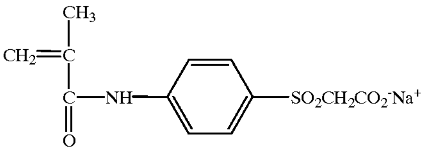

-continued
(42)
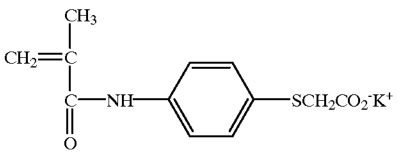
(43)
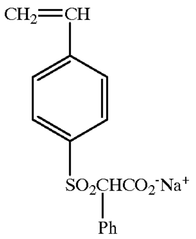
(44)
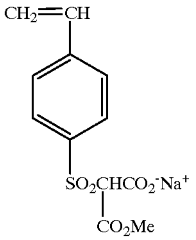
(45)
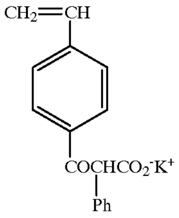
(46)
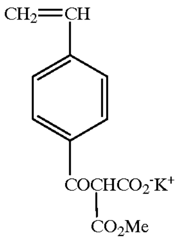
(47)
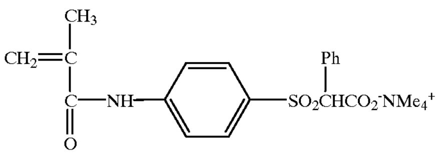
(48)
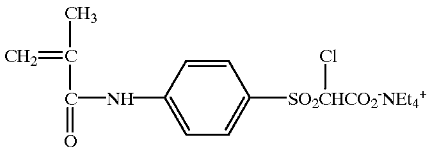
-continued
(49)
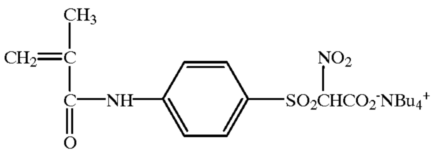
(50)
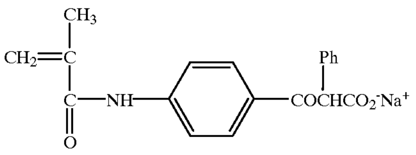
(51)
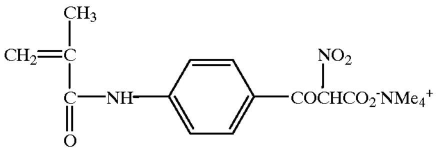
(52)
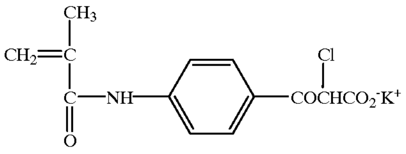
(53)
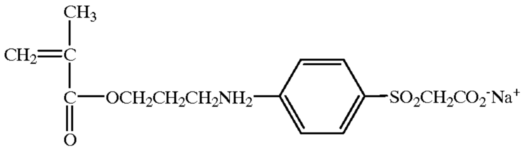
(54)
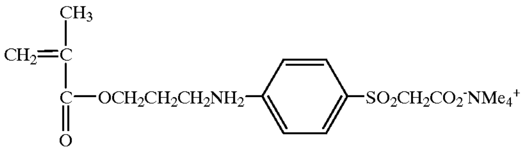
(55)
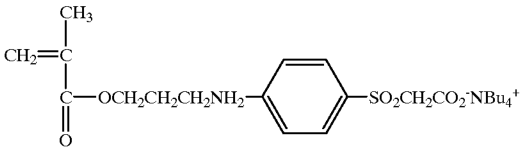
(56)
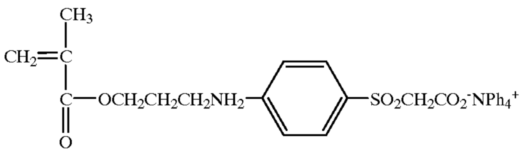
(57)
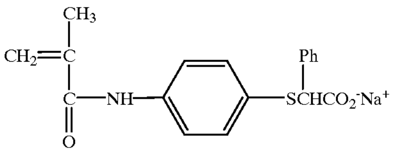

-continued (58)

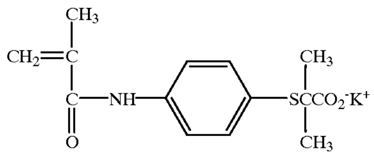

(59)

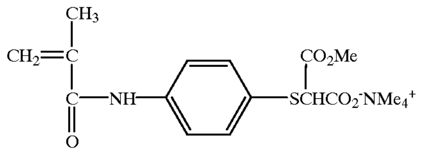

(60)

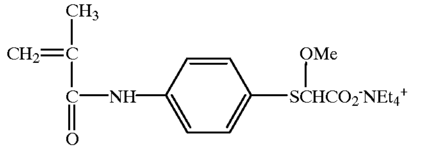

(61)

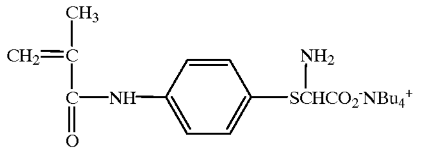

(62)

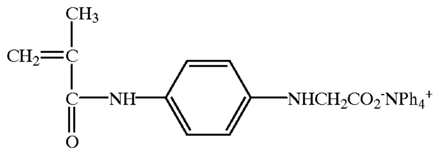

(63)

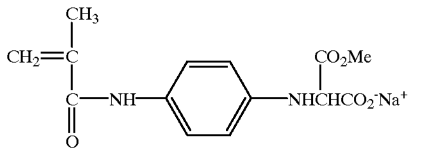

(64)

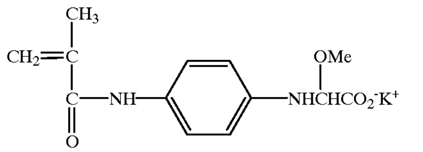

(65)

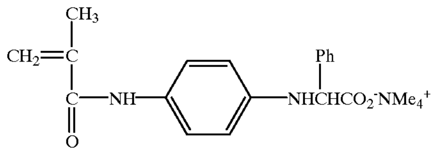

(66)

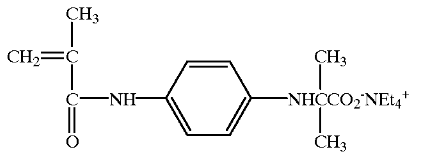

-continued (67)

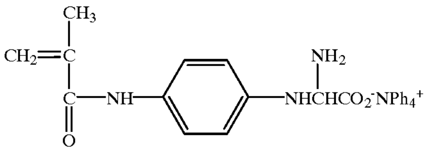

(68)

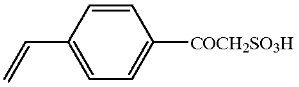

(69)

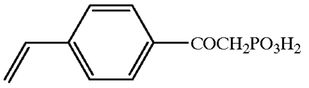

As other monomers, monomers having crosslinking reactivity such as glycidyl methacrylate, N-methylolmethacrylamide and 2-isocyanate ethyl acrylate are preferably used.

In addition, as other monomers for use in the copolymers, well-known monomers, e.g., acrylates, methacrylates, acrylamides, methacrylamides, vinyl esters, styrenes, acrylic acid, methacrylic acid, acrylonitrile, maleic anhydride, and maleic acid imide can also be exemplified.

Specific examples of acrylates include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of methacrylates include methyl methacrylate, ethyl methacrylate, (n- or i-) propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzylmethacrylate, methoxybenzylmethacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenylmethacrylate, hydroxyphenylmethacrylate, chlorophenyl methacrylate, sulfamoylphenyl methacrylate, and 2-(hydroxyphenylcarbonyloxy)ethyl methacrylate.

Specific examples of acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide, and N-hydroxyethyl-N-methylacrylamide.

Specific examples of methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, and N-hydroxyethyl-N-methylmethacrylamide.

Specific examples of vinyl esters include vinyl acetate, vinyl butyrate, and vinyl benzoate.

Specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, and carboxystyrene.

Of these other monomers, acrylates, methacrylates, acrylamides, methacrylamides, vinyl esters, styrenes, acrylic acid, methacrylic acid, and acrylonitrile each having 20 or less carbon atoms are especially preferably used.

The mixing ratio of the monomer having functional group (a) and the monomer having functional group (b) for use in the synthesis of the above-described copolymers is preferably from 10/90 to 99/1, more preferably from 30/70 to 97/3, in weight ratio.

When other monomers are used in the copolymers, the ratio of other monomers to the total of the monomer having functional group (a) and the monomer having functional group (b) for use in the synthesis of the copolymers is preferably from 5 to 99 wt %, more preferably from 10 to 95 wt %.

Specific examples of compounds (i) for use in the present invention are shown below. The numeral values on the right lower side of the parentheses in each structural formula show the copolymerization ratio (molar ratio).

(I-1)

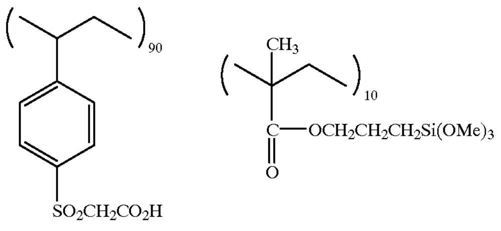

(I-2)

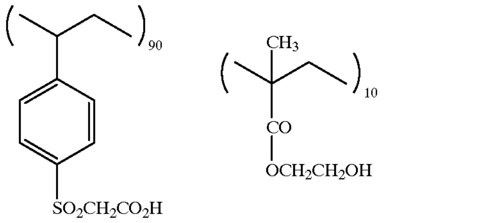

-continued (I-3)

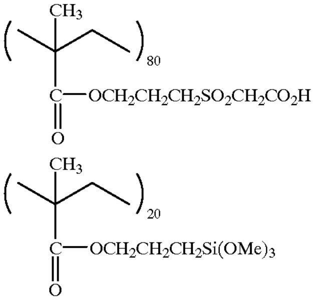

(I-4)

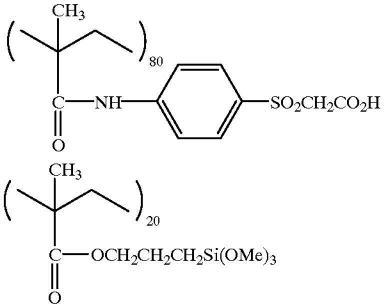

(I-5)

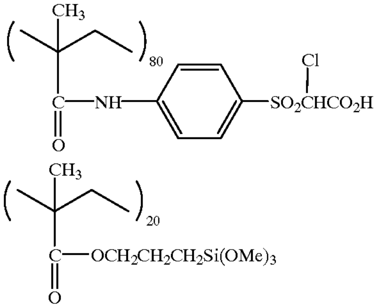

(I-6)

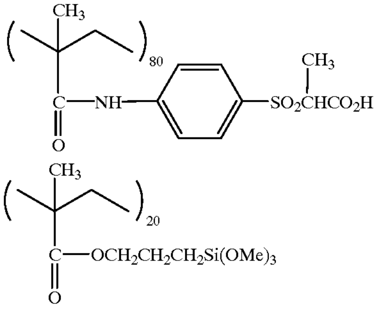

(I-7)

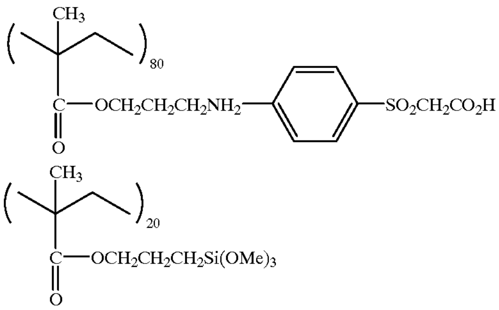

-continued
(I-8)
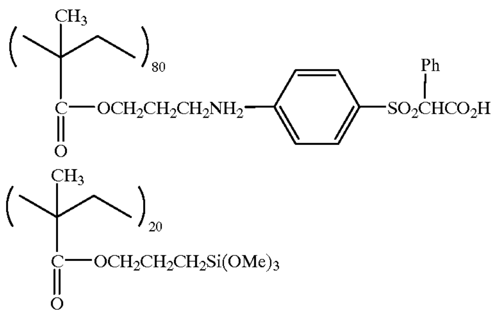
(I-9)
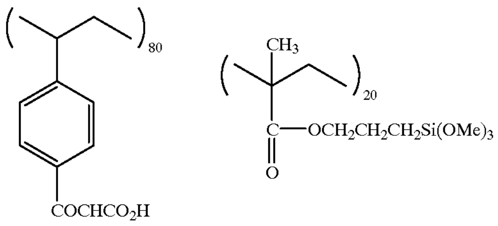
(I-10)
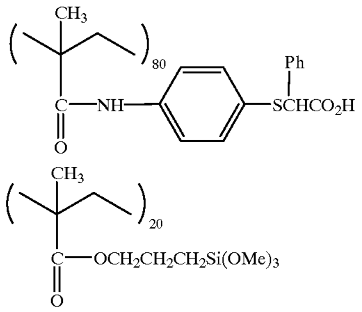
(I-11)
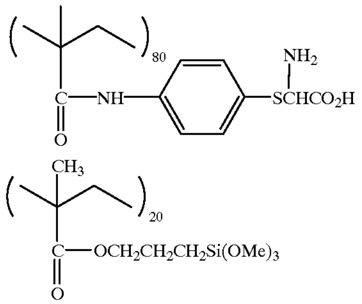
(I-12)
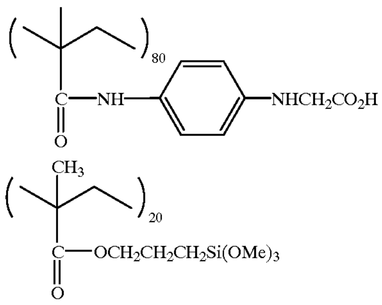
-continued
(I-13)
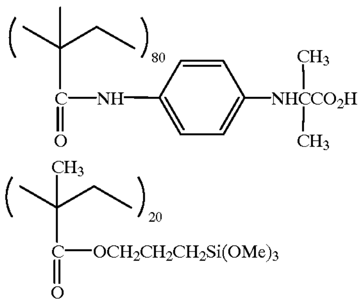
(I-14)
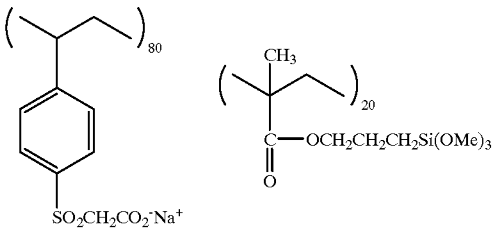
(I-15)
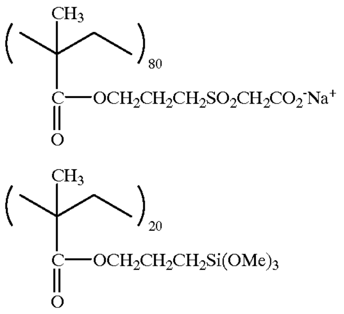
(I-16)
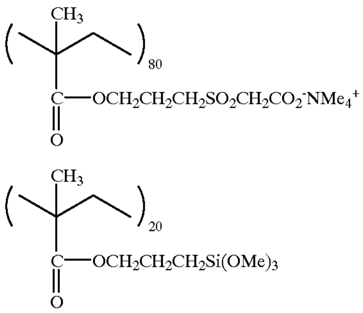
(I-17)
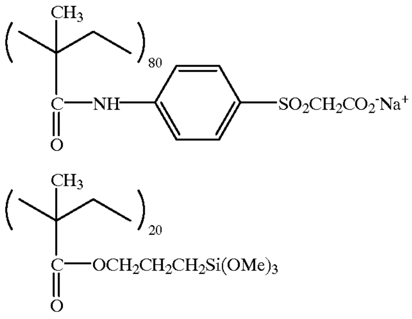

-continued (I-18)

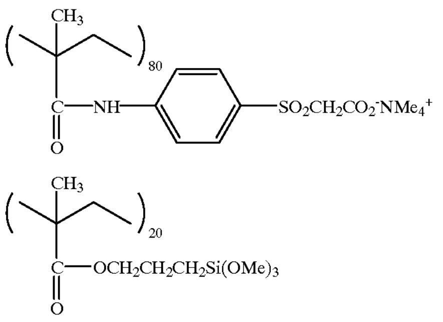

(I-19)

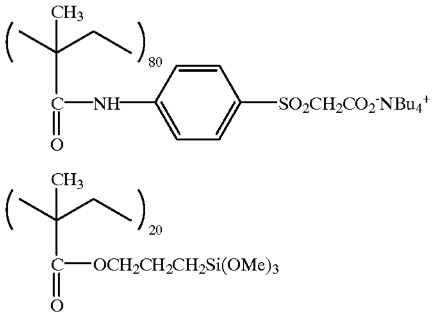

(I-20)

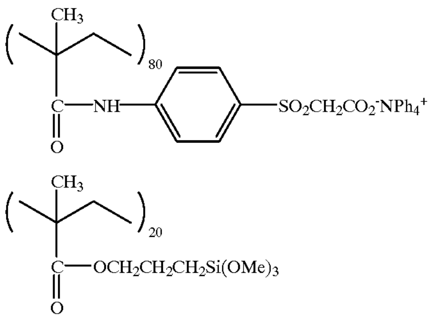

(I-21)

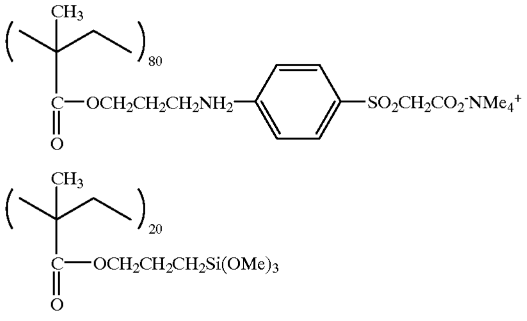

(I-22)

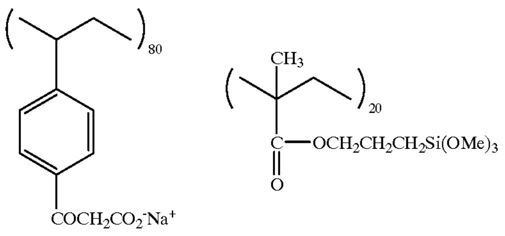

-continued (I-23)

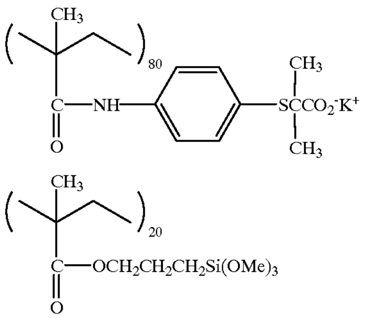

(I-24)

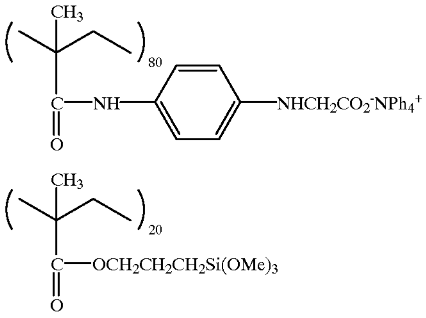

In the next place, (ii) a polymerizable compound by hydrolysis represented by the following formula (6) (hereinafter also referred to as merely "compound (ii)") for use for sol/gel reaction with compound (i) is described below $$(R^5)_n\text{—}X^1\text{—}(OR^6)_{4-n} \tag{6}$$

wherein $R^5$ and $R^6$, which may be the same or different, each represents an alkyl group or an aryl group; $X^1$ represents Si, Al, Ti or Zr; and n represents 0, 1 or 2. When $R^5$ or $R^6$ represents an alkyl group, the number of carbon atoms is preferably from 1 to 4. The alkyl or aryl group may have a substituent. Compound (ii) is a low molecular weight compound and preferably the molecular weight is 1,000 or less.

Compound (ii) or a hydrolyzed product thereof forms a matrix of an inorganic oxide in the film by hydrolysis polymerization and reacts with functional group (b) in compound (i), also forms porous organic and inorganic composites (reaction products) by the adsorption onto water-insoluble solid particles described later, thus the crosslinking structure becomes dense and the film strength is increased throughout, and the discrimination of an image area and a nonimage area is improved as well.

Further, the later-described adsorption of compound (ii) onto water-insoluble particles is presumably due to chemical adsorption or physical adsorption or both of them. Compound (ii) may have functional group (b') for this adsorption.

Since functional group (b') is almost the same as functional group (b), functional group (b') is not further described below.

As the compounds containing aluminum in compound (ii) e.g., trimethoxy aluminate, triethoxy aluminate, tripropoxy aluminate, and tetraethoxy aluminate can be exemplified. As the compounds containing titanium, e.g., trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate can be exemplified. As the compounds containing zirconium, e.g., the compounds containing zirconate corresponding to those containing titanium, i.e., compounds replacing titanate with zirconate, can be exemplified.

As the compounds containing silicon in compound (ii) e.g., trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, dimethyldiethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, and diphenyldiethoxysilane can be exemplified. Of these, tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane, and diphenyldiethoxysilane are particularly preferred.

Compound (ii) may be used alone or two or more kinds may be used in combination. Compound (ii) may be condensed by dehydration after partial hydrolysis. If necessary, trialkylmonoalkoxysilane can be added to compound (ii) for adjusting the physical properties of the reaction product. Although compound (ii) is a compound constituting an inorganic phase in the material of the recording layer of the present invention, for increasing the storage stability of the recording layer material in the state of a solution before being coated on the substrate of the lithographic printing plate precursor of the present invention, it is effective to protect the active metallic hydroxyl group of the inorganic polymer obtained by partial hydrolysis polymerization of compound (ii), e.g., a silanol group (Si—OH) The protection of a silanol group can be effected by esterifying the silanol group (Si—OR) with higher alcohols, e.g., tert-butanol and iso-propyl alcohol. Specifically, the protection can be performed by adding the foregoing alcohols to the organic phase. According to the nature of the inorganic phase, the storage stability of compound (ii) can be further increased at this time by dehydrating the inorganic phase, for example, by means of heating the inorganic phase and distilling off the eliminated water. When acids or bases capable of being catalysts of the hydrolysis polymerization, e.g., hydrochloric acid or ammonia, are present in the inorganic phase, it is also generally effectual to lower the concentration of them. This is easily performed by neutralizing the inorganic phase with an acid or a base.

Compound (ii) is preferably used in an amount of from 3 to 95 wt %, more preferably from 10 to 80 wt %, based on the total solid contents of the recording layer of the lithographic printing plate precursor used in the present invention.

In the next place, polymers which are obtained by photopolymerization or thermal polymerization reaction to be added, as the crosslinked polymer having functional group (a), to the recording layer of the lithographic printing plate precursor used in the present invention, other than those obtained by a sol/gel reaction, are described below.

There are methods by photo-dimerization and radical photopolymerization in photo-crosslinking. There are methods by epoxy crosslinking, isocyanate crosslinking and methylol crosslinking in thermal-crosslinking. In any of these methods, a crosslinking reactive group is incorporated into a polymer and crosslinking is performed by the reaction of the polymer by itself or with a monomer.

In photo-dimerization reaction, crosslinking reaction can be caused by light absorption of the functional group of the polymer itself or by light irradiation using a photosensitizer.

In radical photopolymerization crosslinking, crosslinking reaction can be caused by light irradiation using a well-known photopolymerization initiator.

In thermal-crosslinking such as epoxy crosslinking, isocyanate crosslinking and methylol crosslinking, crosslinking is effected by heating using a catalyst such as acids and organic metals.

Of the photo-crosslinking and thermal-crosslinking methods, the former is more effective in that crosslinking is effected without heating and functional group (a) which is converted from hydrophilic to hydrophobic due to any of acids, radiation and heat can be protected.

A polymer which is crosslinked by a photo-crosslinking reaction can be obtained by copolymerizing a monomer having a photo-crosslinkable functional group, which is also known as a photo-curing functional group, and a monomer having functional group (a) whose hydrophilic property is converted due to any of acids, radiation and heat A polymer which is crosslinked by a thermal-crosslinking reaction can be obtained by copolymerizing a monomer having a thermal-crosslinkable group and a monomer having functional group (a) whose hydrophilic property is converted due to any of acids, radiation and heat.

"Thermal- and/or photo-curing functional groups" are functional groups which undergo a setting reaction of a resin due to at least either heat or light.

As specific photo-curing functional groups, the functional groups used in photosensitive resins and the like conventionally well-known as photosetting resins exemplified in Inui and Nagamatsu, *Kankosei Kobunshi* (*Photosensitive High Polymers*), Kodansha Publishing Co., Ltd. (1977), Tsunoda, *Shin-Kankosei Jushi* (*New Photosensitive Resins*), Insatsu Gakkai, Publishing Division (1981), G. E. Green and B. P. Strak, *J. Macro. Sci. Reas. Macro. Chem.,* C21 (2), pp. 187 to 273 (1981–82), and C. G. Rattey, *Photopolymerization of Surface Coatings,* A. Wiley Interscience Pub. (1982) can be used in the present invention.

Furthermore, as the thermosetting functional groups in the present invention, the functional groups exemplified, e.g., in Tsuyoshi Endo, *Netsu Kokasei Kobunshi no Seimitsuka* (*Making into Precision of Thermosetting High Polymers*), C.M.C. Publishing Co., Ltd. (1986), Yuji Harasaki, *Saishin Binder Gijutsu Binran* (*Handbook of the Latest Techniques of Binders*), Chap. II-1, Sogo Gijutsu Center (1985), Takayuki Ohtsu, *Acryl Jushino Gosei Sekkei to Shin Yoto Kaihatsu* (*Syntheses and Designs of Acrylate Resins and Opening up of New Avenues of Use*), Publishing Division of Chubu-Keiei-Kaihatsu Center (1985), and Eizo Ohmori, *Kinosei Acryl-kei Jushi* (*Functional Acrylate resins*), Techno System (1985) can be used.

For example, as such functional groups, a —COOH group, a $—PO_3H_2$ group, an $—SO_2H$ group, an —OH group, an —SH group, an $—NH_2$ group, an $—NHR^{12}$ group [wherein $R^{12}$ represents a hydrocarbon group, e.g., an alkyl group having from 1 to 8 carbon atoms (e.g., methyl, ethyl, propyl, butyl, hexyl, octyl, 2-chloroethyl, 2-methoxyethyl, 2-cyanoethyl)], a cyclic acid anhydride-containing group, an —N=C=O group, a blocked isocyanate group, a $—CONHCH_2OR^{13}$ group [wherein $R^{13}$ represents a hydrogen atom or an alkyl group having from 1 to 18 carbon atoms (specifically, the same as the alkyl group represented by $R^{12}$)], a polymerizable double bond group, a photo-crosslinkable double bond group, an epoxy group, an isocyanate group, a methylol group,

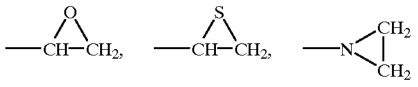

can be exemplified.

The cyclic acid anhydride-containing group is a group containing at least one cyclic acid anhydride, and aliphatic dicarboxylic anhydride and aromatic dicarboxylic anhydride can be exemplified as the cyclic acid anhydride to be contained.

Examples of the aliphatic dicarboxylic anhydride include a succinic anhydride ring, a glutaconic anhydride ring, a maleic anhydride ring, a cyclopentane-1,2-dicarboxylic anhydride ring, a cyclohexane-1,2-dicarboxylic anhydride ring, a cyclohexene-1,2-dicarboxylic anhydride ring, and a 2,3-bicyclo[2.2.2]octanedicarboxylic anhydride ring, and these rings may be substituted with a halogen atom, e.g., chlorine or bromine, or an alkyl group, e.g., methyl, ethyl, butyl or hexyl.

Examples of the aromatic dicarboxylic anhydride include a phthalic anhydride ring, a naphthalenedicarboxylic anhydride ring, a pyridinedicarboxylic anhydride ring, and a thiophenedicarboxylic anhydride ring, and these rings may be substituted with a halogen atom, e.g., chlorine or bromine, an alkyl group, e.g., methyl, ethyl, propyl or butyl, a hydroxyl group, a cyano group, a nitro group, or an alkoxycarbonyl group (as the alkoxyl group, e.g., methoxy and ethoxy are used).

As the blocked isocyanate groups, functional groups which are adducts of isocyanate groups and active hydrogen compounds and form isocyanate groups by decomposition by heat can be exemplified. As the active hydrogen compounds, e.g., 2,2,2-trifluoroethanol, 2,2,2,2',2',2'-hexafluoroisopropyl alcohol phenols (e.g., phenol, chlorophenol, cyanophenol, cresol, methoxyphenol), active methylene compounds (e.g., acetylacetone, acetoacetic esters, malonic diesters, malonic dinitrile), and cyclic nitrogen-containing compounds (e.g., imidazole, piperazine, morpholine) can be exemplified.

As the polymerizable double bond groups, $CH_2{=}CH{-}$, $CH_2{=}CHCH_2{-}$, $CH_2{=}CHCOO{-}$, $CH_2{=}C(CH_3)COO{-}$, $C(CH_3)H{=}CHCOO{-}$, $CH_2{=}CHCONH{-}$, $CH_2{=}C(CH_3)CONH{-}$, $C(CH_3)H{=}CHCONH{-}$, $CH_2{=}CHOCO{-}$, $CH_2{=}C(CH_3)OCO{-}$, $CH_2{=}CHCH_2OCO{-}$, $CH_2{=}CHNHCO{-}$, $CH_2{=}CHCH_2NHCO{-}$, $CH_2{=}CHSO_2{-}$, $CH_2{=}CHCO{-}$, $CH_2{=}CHO{-}$, and $CH_2{=}CHS{-}$ can be exemplified as specific examples.

As the photo-crosslinkable double bond groups, $-CH{=}CH-$, $-C(CH_3){=}C(CH_3)-$,

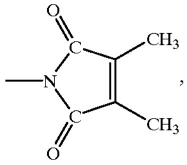

,

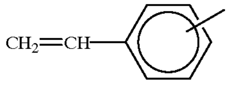

can be exemplified as specific examples.

As the photo-crosslinkable double bond group, a maleimido group represented by the following formula (A) is particularly preferred.

(A)

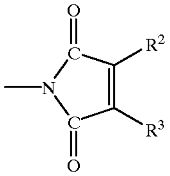

wherein $R^2$ and $R^3$each represents a hydrogen atom, a halogen atom or an alkyl group, and $R^2$ and $R^3$ may be bonded to each other to form a 5- or 6-membered ring.

As the alkyl group represented by $R^2$ and $R^3$, an alkyl group having from 1 to 4 carbon atoms is preferably used, and particularly preferably a methyl group. It is also preferred for $R^2$ and $R^3$ to be bonded to each other to form a 6-membered ring. Preferred halogen atoms are a chlorine atom, a bromine atom and an iodine atom.

Specific examples of the maleimido groups are disclosed, e.g., in JP-A-52-988 (corresponding to U.S. Pat. No. 4,079,041), West German Patent 2,626,769, EP 21019, EP 3552, *Die Angewandte Mackromolekulare Chemi,* 115, pp. 163 to 181 (1983), JP-A-49-128991 to 128993, JP-A-50-5376 to 5380, JP-A-53-5298 to 5300, JP-A-50-50107, JP-A-51-47940, JP-A-52-13907, JP-A-50-45076, JP-A-52-121700, JP-A-50-10884, JP-A-50-45087, JP-A-58-43951, West German Patents 2,349,948 and 2,616,276.

Of the above-described maleimido groups, the monomers represented by the following formulae (B) to (D) can be used in the present invention.

(B)

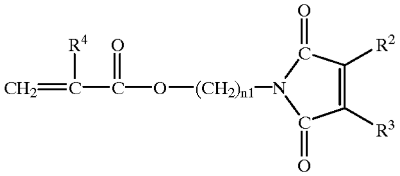

(C)

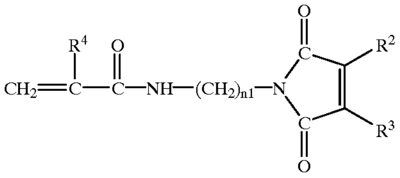

(D)

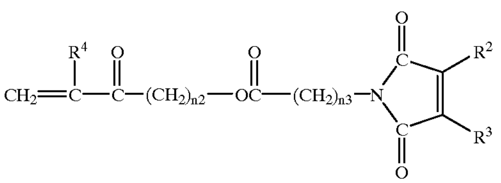

wherein $R^2$ and $R^3$ each has the same meaning as $R^2$ and $R^3$ in formula (A), $R^4$ represents a hydrogen atom or a methyl group, and $n_1$, $n_2$ and $n_3$ each represents an integer, preferably from 1 to 6.

Monomers which can be used in radical photopolymerization crosslinking are compounds containing an addition polymerizable double bond, and specifically such monomers can be selected from among the compounds having at least one, preferably two or more, ethylenically unsaturated bond at terminals.

These compounds have, for example, the chemical form of a monomer, a prepolymer, i.e., a dimer, a trimer, and an oligomer, or mixtures and copolymers of them.

As examples of monomers and copolymers thereof, esters of unsaturated carboxylic acids (e.g., acrylic acid, methacrylic acid, itaconic acid, crotonic acid, isocrotonic acid, maleic acid) and aliphatic polyhydric alcohol compounds, and amides of unsaturated carboxylic acids and aliphatic polyhydric amine compounds are exemplified.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane-tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, tetramethylolmethane tetraacrylate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, etc.

As itaconates, examples include ethylene glycol diitaconate, propylene glycol diitaconate, 1,3-butanediol diitaconate, 1,4-butanedioldiitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

The mixtures of the above-described ester monomers are also exemplified.

Specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other example, a vinyl urethane compound having two or more polymerizable vinyl groups in one molecule can be exemplified, which is obtained by the addition of a vinyl monomer having a hydroxyl group represented by the following formula (E) to a polyisocyanate compound having two or more isocyanate groups in one molecule as disclosed in JP-B-48-41708 (the term "JP-B" as used herein means an "examined Japanese patent publication").

$$CH_2{=}C(R^{14})COOCH_2CH(R^{15})OH \qquad (E)$$

wherein $R^{14}$ and $R^{15}$ each represents H or $CH_3$.

Further, polyfunctional acrylates and methacrylates such as urethane acrylates as disclosed in JP-A-51-37193, polyester acrylates and epoxy acrylates obtained by reacting epoxy resins with (meth)acrylic acids as disclosed in JP-A-48-64183, JP-B-49-43191 and JP-B-52-30490 can be exemplified. Moreover, photosetting monomers and oligomers introduced into *Nihon-Setchaku-Kyokai-shi* (*Jounal of The Japan Adhesion Society*), Vol. 20, No. 7, pp. 300 to 308 (1984) can be used as well. These functional groups are used in an amount of from 5 to 70 wt %, preferably from 10 to 50 wt %, based on the total components.

Various photopolymerization initiators well known in patents and literature, and series comprising two or more photopolymerization initiators in combination can arbitrarily be applied to the photopolymerization initiator for use in the above-described photo-crosslinking reaction selectively according to the wavelength of the light source to be used.

For example, when a light source in the vicinity of 400 nm is used, benzyl, benzoin ether, Michler's ketone, anthraquinone, thioxanthone, acridine, phenazine, benzophenone, etc., are widely used as a photopolymerization initiator.

As the foregoing photosensitizers, photo-dimerized sensitizers disclosed in EP 591786 and A. Reiser, *Photoreactive Polymers,* Wiley Interscience (1989) can be used.

Examples of the polymers which can be obtained by photo-crosslinking or thermal-crosslinking are shown below.

KP-1

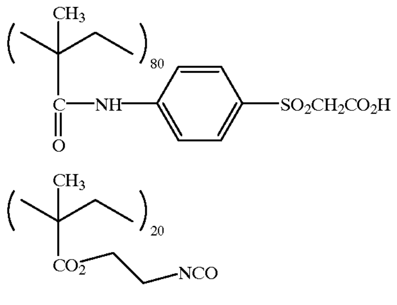

KP-2

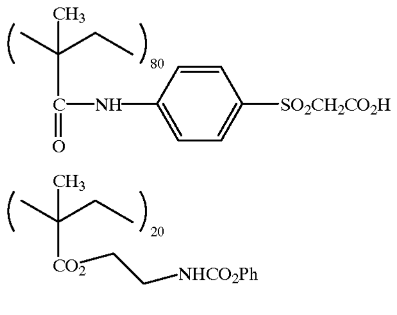

-continued
KP-3
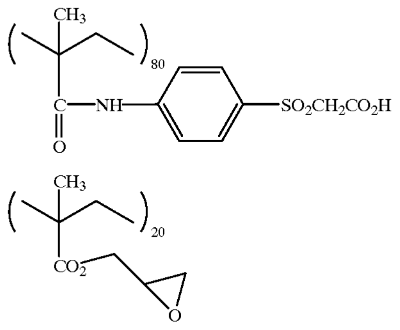
KP-4
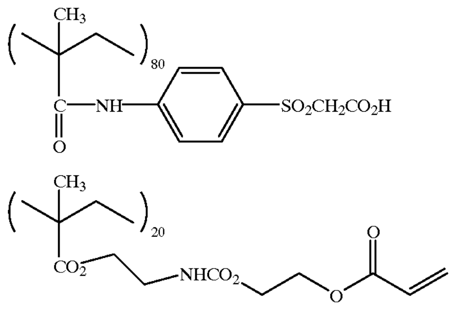
KP-5
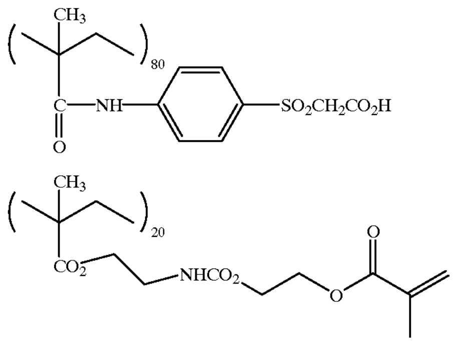
KP-6
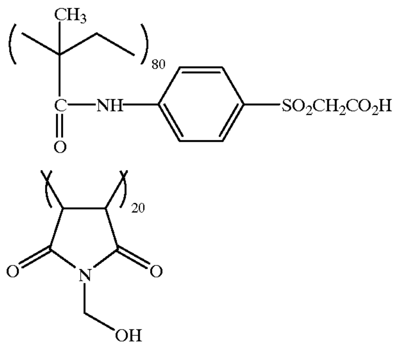
-continued
KP-7
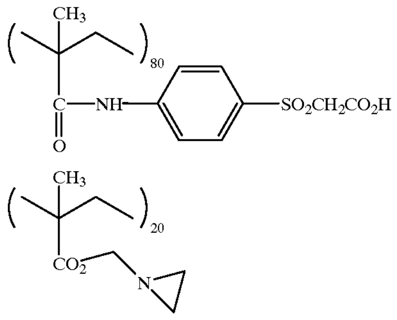
KP-8
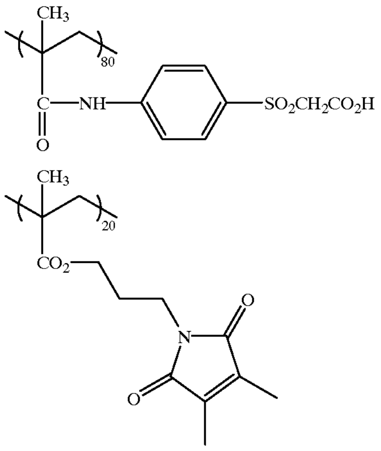
KP-9
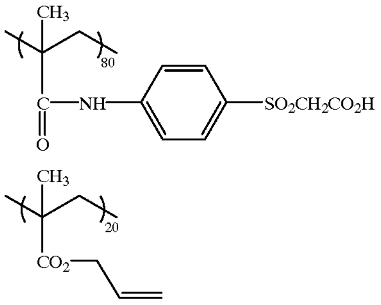
KP-10
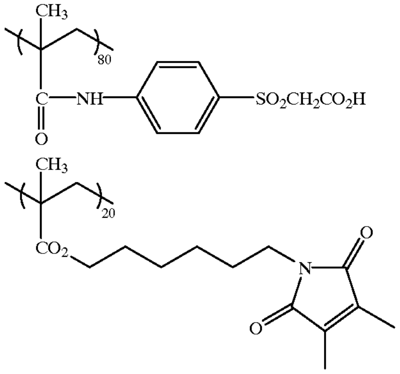

-continued

KP-11

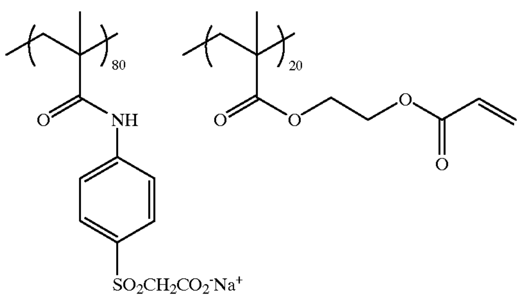

KP-12

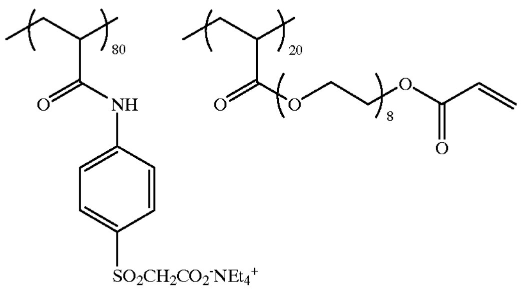

KP-13

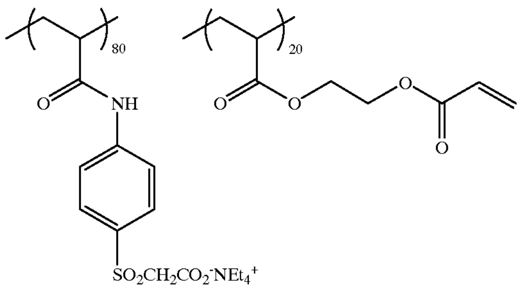

KP-14

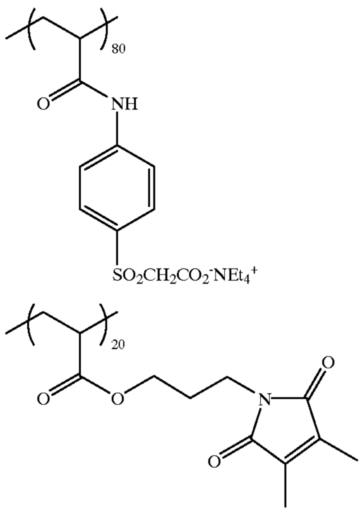

-continued

KP-15

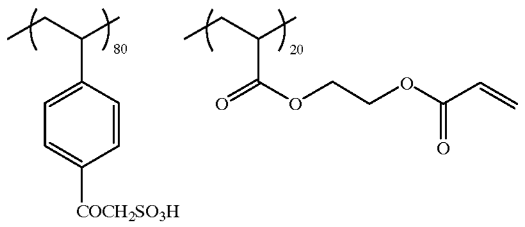

KP-16

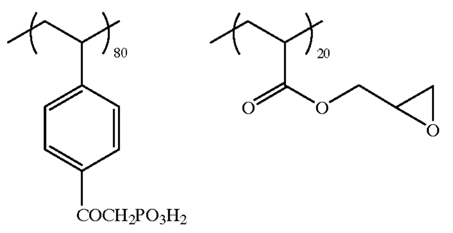

Water-Insoluble Particles

A radiation-sensitive material (a heat-sensitive image-forming material) or a radiation-sensitive layer (an image-forming layer) of the lithographic printing plate precursor according to the present invention can contain (iii) water-insoluble particles. When water-insoluble particles are contained in the radiation-sensitive layer, an uneven surface is formed, and if the surfaces of the particles are hydrophilic, water is retained in the voids among the particles to form a hydrophilic surface, and if the surfaces of the particles are hydrophobic, water does not soak into the voids among the particles, thus the particle layer forms a water-repellent surface, i.e., a lipophilic surface. That is, a lithographic printing plate excellent in the discrimination of hydrophilicity/hydrophobicity can be obtained.

The water-insoluble particles (hereinafter also referred to as merely “solid particles”) contained in the radiation-sensitive layer of the lithographic printing plate precursor of the present invention have good affinity with and adhesive property to the crosslinked polymers described above. The solid particles to improve water retentivity may be granular particles, or the particles may be surface-treated particles for improving dispersibility. These particles can be used alone selected from inorganic particles, metallic particles and organic particles, or two or more kinds can be used in arbitrary combination.

As such inorganic particles, e.g., metallic oxides, such as zinc oxide, titanium dioxide, iron oxide, and zirconia; silicon-containing oxides which themselves do not have absorption in the visible region and called white carbon, such as silicic anhydride, hydrated calcium silicate, and hydrated aluminum silicate; and clay mineral particles, such as clay, talc, kaolin and zeolite can be used. Further, as metallic particles, e.g., aluminum, copper, nickel, silver and iron can be used.

As metallic particles, iron is preferably used, but metallic oxide, metallic nitride, metallic sulfide, and metallic carbide may be used besides an iron simplex. When an iron simplex is used, treatment in the air is complicated and is attended with danger of spontaneous combustion on contact with air.

Therefore, several nanometers in thickness from the surfaces of metallic particles are preferably covered with oxides, nitrides, sulfides or carbides.

Any iron powders are preferably used, above all, iron alloy powders containing α-Fe as a main component are preferred. These powders may contain, in addition to the prescribed atoms, the following atoms, e.g., Al, Si, S, Sc, Ca, Ti, V, Cr, Cu, Y, Mo, Rh, Pd, Ag, Sn, Sb, Te, Ba, Ta, W, Re, Au, Hg, Pb, Bi, La, Ce, Pr, Nd, P, Co, Mn, Zn, Ni, Sr and B. In particular, it is preferred to contain at least one of Al, Si, Ca, Y, Ba, La, Nd, Co, Ni and B, in addition to α-Fe, and more preferably at least one of Co, Y and Al is contained in addition to α-Fe. The content of Co is preferably from 0 to 40 atomic %, more preferably from 15 to 35 atomic %, and most preferably from 20 to 35 atomic %, the content of Y is preferably from 15 to 12 atomic %, more preferably from 3 to 10 atomic %, and most preferably from 4 to 9 atomic %, the content of Al is preferably from 1.5 to 12 atomic %, more preferably from 3 to 10 atomic %, and most preferably from 4 to 9 atomic %, each based on Fe. Iron alloy powders may contain a small amount of a hydroxide or an oxide.

Specific examples thereof are disclosed in JP-B-44-14090, JP-B-45-18372, JP-B-47-22062, JP-B-47-22513, JP-B-46-28466, JP-B-46-38755, JP-B-47-4286, JP-B-47-12422, JP-B-47-17284, JP-B-47-18509, JP-B-47-18573, JP-B-39-10307, JP-B-46-39639, U.S. Pat. Nos. 3,026,215, 3,031,341, 3,100,194, 3,242,005, and 3,389,014.

More specifically, α-iron alloy fine powders having Fe/Co/Al/Y ratio of 100/20/5/5, a long axis length of 0.1 μm, a short axis length of 0.02 μm, and specific surface area of 60 $m^2/g$ are preferred.

Inorganic particles or metallic particles have an average particle size of 10 μm or less, preferably from 0.01 to 10 μm, more preferably from 0.1 to 5 μm, and most preferably from 1 to 5 μm. When the average particle size of inorganic particles or metallic particles is less than 0.01 μm, the water retentivity of the laser-exposed area is insufficient and scumming is liable to occur, while when the average particle size is more than 10 μm, the resolution of the printed matters deteriorates, the adhering property of the recording layer to the support lowers, and the particles in the vicinity of the surface are liable to come off the surface.

Inorganic particles or metallic particles are contained in the recording layer in an amount of from 10 to 95 vol %, preferably from 20 to 95 vol %, and more preferably from 40 to 90 vol %, based on the entire composition. When the content of these particles is less than 10 vol %, the water retentivity of the laser-exposed area on the recording layer surface is insufficient and scumming is liable to occur, while when the content is more than 95 vol %, the recording layer strength lowers, as a result, the press life deteriorates, and the adhering property of the recording layer to the support lowers.

Organic particles can also be used as granular particles besides inorganic particles or metallic particles. Organic particles are not especially restricted so long as they can improve water retentivity but resin particles can be used as the granular organic particles. When a solvent is used for dispersing resin particles, it is necessary to take care to select resin particles which are not dissolved in the solvent or a solvent which does not dissolve the resin particles. Moreover, when resin particles are dispersed by a thermoplastic polymer and heat, resin particles which do not melt, are not deformed or are not decomposed by the heat for dispersion should be selected.

Taking the above-described points into consideration, crosslinked resin particles are preferably used. Organic particles have an average particle size of from 0.01 to 10 μm, preferably from 0.05 to 10 μm, and more preferably from 0.1 to 5 μm. When the average particle size of organic particles is less than 0.01 μm, the water retentivity of the laser-exposed area is insufficient and scumming is liable to occur, while when the average particle size is more than 10 μm, the resolution of the printed matters deteriorates, the adhering property of the recording layer to the support lowers, and the particles in the vicinity of the surface are liable to come off the surface.

Organic particles are contained in the recording layer in an amount of from 2 to 90 vol %, preferably from 5 to 80 vol %, and more preferably from 10 to 50 vol %, based on the entire composition. When the content of the particles is less than 2 vol %, the water retention of the laser-exposed area on the recording layer surface is insufficient and scumming is liable to occur, while when the content is more than 90vol %, the recording layer strength lowers, as a result, the press life deteriorates, and the adhering property of the recording layer to the support lowers.

As the organic particles, polystyrene particles (having a particle size of from 4 to 10 μm) and silicone resin particles (having a particle size of from 2 to 4 μm) can be exemplified. As the crosslinked resin particles, e.g., microgels comprising two or more ethylenically unsaturated monomers (having a particle size of from 0.01 to 1 μm), crosslinked resin particles comprising styrene and divinylbenzene (having a particle size of from 4 to 10 μm), crosslinked resin particles comprising methyl methacrylate and diethylene glycol dimethacrylate (having a particle size of from 4 to 10 μm), etc., i.e., microgels of acrylate resin, crosslinked polystyrene and crosslinked methyl methacrylate, etc., can be exemplified. These organic particles can be produced by general methods, such as emulsion polymerization, soap free emulsion polymerization, seed emulsion polymerization, dispersion polymerization, suspension polymerization, etc.

It is also possible to prepare inorganic particles from a solution. For example, metallic lower alkoxide is added to a solvent, e.g. ethanol, thereby inorganic particles containing the metal can be obtained in the presence of water and acid or alkali. When the thus-obtained inorganic particle solution is added to a solvent-soluble thermoplastic polymer solution, an inorganic particle dispersion solution can be obtained. Alternatively, metallic lower alkoxide is added to a thermoplastic polymer solution in the first place and then water and acid or alkali are added thereto, thereby inorganic particles containing the metal can be obtained.

When inorganic particles are prepared by adding metallic lower alkoxide to the solution of a thermoplastic polymer precursor, a composite of the polymer and the inorganic particles is obtained at the time of making the thermoplastic polymer precursor to a thermoplastic polymer by heating. Tetraethoxysilane, tetraethoxytitanium can be used as the metallic lower alkoxide.

Light/Heat Converting Substance

It is preferred that a radiation-sensitive material (a heat-sensitive image-forming material) or the lithographic printing plate precursor according to the present invention contain a light/heat converting substance. Every substance which can absorb light such as ultraviolet rays, visible rays, infrared rays, white light, etc., and convert the absorbed light to heat can be used as such a light/heat converting substance. For example, carbon black, carbon graphite, pigments, phthalocyanine series pigments, iron powders, graphite powders, iron oxide powders, lead oxide, silver oxide, chromium oxide, iron sulfide, and chromium sulfide can be exemplified as such a light/heat converting substance. Dyes, pigments and metals which effectively absorb infrared rays of wavelength of from 760 nm to 1,200 nm are especially preferred.

As dyes for this purpose, those commercially available and known dyes described, e.g., in *Senzyo Binran* (*Dye Handbook*), compiled by Yuki-Gosei-Kagaku-Kyokai (1970) can be utilized. Specifically, azo dyes, metal complex azo dyes, pyrazolone azo dyes, anthraquinone dyes, phthalocyanine dyes, carbonium dyes, quinoneimine dyes, methine dyes, cyanine dyes and metal thiolate complexes can be used. As preferred dyes, e.g., cyanine dyes disclosed in JP-A-58-125246, JP-A-59-84356, JP-A-59-202829, and JP-A-60-78787, methine dyes disclosed in JP-A-58-173696, JP-A-58-181690, and JP-A-58-194595, naphthoquinone dyes disclosed in JP-A-58-112793, JP-A-58-224793, JP-A-59-48187, JP-A-59-73996, JP-A-60-52940, and JP-A-60-63744, squarylium dyes disclosed in JP-A-58-112792, and cyanine dyes disclosed in British Patent 434,875 can be exemplified.

Further, near infrared-absorbing sensitizers disclosed in U.S. Pat. No. 5,156,938 are also preferably used. In addition, substituted arylbenzo(thio)pyrylium salts disclosed in U.S. Pat. No. 3,881,924, trimethine thiapyrylium salts disclosed in JP-A-57-142645 (corresponding to U.S. Pat. No. 4,327,169), pyrylium-based compounds disclosed in JP-A-58-181051, JP-A-58-220143, JP-A-59-41363, JP-A-59-84248, JP-A-59-84249, JP-A-59-146063, and JP-A-59-146061, cyanine dyes disclosed in JP-A-59-216146, pentamethine thiopyrylium salts disclosed in U.S. Pat. No. 4,283,475, and pyrylium compounds disclosed in JP-B-5-13514 and JP-B-5-19702 are also preferably used. As other examples of preferred dyes, near infrared-absorbing dyes disclosed in U.S. Pat. No. 4,756,993 as the compounds represented by formulae (I) and (II) can be exemplified. Of the above-described dyes, especially preferred dyes are cyanine dyes, squarylium dyes, pyrylium salts, and nickel thiolate complexs.

As the pigments for use in the present invention, those commercially available and pigments described in *Color Index* (*C.I.*) *Binran* (*Color Index* (*C.I.*) *Handbook*), *Saishin-Ganryo-Binran* (*The Latest Pigment Handbook*), compiled by Nihon Ganryo Gijutsu Kyokai (1977), *Saishin-Ganzyo-Oyo-Gijutsu* (*The Latest Pigment Applied Techniques*), published by CMC Publishing Co. (1986), *Insatsu Ink Gijutsu* (*Printing Ink Techniques*), CMC Publishing Co. (1984) can be used.

Various kinds of pigments can be used, e.g., black pigments, yellow pigments, orange pigments, brown pigments, red pigments, purple pigments, blue pigments, green pigments, fluorescent pigments, metal powder pigments, and polymer linkage pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used. Carbon black is the most preferred of these pigments.

These pigments can be used without surface treatment or may be surface-treated. As methods of surface treatments, a method of surface-coating with resins and waxes, a method of adhering surfactants, and a method of linking reactive substances (e.g., silane coupling agents, epoxy compounds and polyisocyanate) on the surfaces of pigments can be exemplified. These surface treatment methods are described in *Kinzoku-Sekken-no-Seishitsu-to-Oyo* (*Natures and Applications of Metal Soaps*), Saiwai Shobo Co., *Insatsu-Ink-Gijutsu* (*Printing Ink Techniques*), CMC Publishing Co. (1984), and *Saishin-Ganryo-Oyo-Gijutsu* (*The Latest Pigment Applied Techniques*), CMC Publishing Co. (1986).

These pigments preferably have a particle size of from 0.01 to 10 $\mu$m, more preferably from 0.05 to 1 $\mu$m, and particularly preferably from 0.1 to 1 $\mu$m. If the particle size of pigments is less than 0.1 $\mu$m, it is not preferred from the viewpoint of the stability of the dispersion in a photosensitive layer-coating solution, while when it exceeds 10 $\mu$m, it is not preferred in view of the uniformity of an image-forming layer.

Well-know methods in the manufacture of inks and toners can be used as dispersing methods of pigments. Examples of dispersing apparatus include a sand mill, an attritor, a pearl mill, a super-mill, a ball mill, an impeller, a disperser, a KD mill, a colloid mill, a dynatron, a three-roll mill, a pressure kneader, etc., and details are described in *Saishin-Ganryo-Oyo-Gijutsu* (*The Latest Pigment Applied Techniques*), CMC Publishing Co. (1986).

Metallic powders and metallic compound powders are described below.

Metallic compounds are specifically metallic oxide, metallic nitride, metallic sulfide, and metallic carbide.

Examples of metals include Mg, Al, Si, Ti, V, Cr, Mn, Fe, Co, Ni, Cu, Zn, Ga, Ge, Y, Zr, Nb, Mo, Tc, Ru, Pd, Ag, Cd, In, Sn, Sb, Hf, Ta, W, Re, Os, Ir, Pt, Au, Pb, etc. Of these metals, those which can particularly easily generate an exothermic reaction such as oxidation reaction by heat energy are preferred, specifically Al, Si, Ti, V, Cr, Mn, Fe, Co, Ni, Cu, Zn, Y, Zr, Mo, Ag, In, Sn and W are particularly preferred. As the metals which have high absorbance of radiation and large heat energy of self-exothermic reaction, Fe, Co, Ni, Cr, Ti and Zr are preferred.

Further, these metals may comprise a metal simplex alone or may comprise two or more components. Metallic powders consisting of metals with metallic oxides, metallic nitrides, metallic sulfides, and metallic carbides may also be used. A metal simplex rather gives large self-exothermic reaction heat energy such as oxidation etc. but treatment in the air is complicated and is attended with danger of spontaneous combustion on contact with air. Therefore, several nanometers in thickness from the surfaces of metallic powders are preferably covered with oxides, nitrides, sulfides or carbides.

These metals may be particles or may be thin films such as deposited films, but particles are preferred when they are used in combination with organic substances. The particle size of particles is 10 $\mu$m or less, preferably from 0.005 to 5 $\mu$m, and more preferably from 0. 01 to 3 $\mu$m. When the particle size is less than 0.01 $\mu$m, the dispersion of particles are difficult and when more than 10 $\mu$m, the resolution of printed matters is deteriorated.

Moreover, the transmission density of a recording layer is preferably from 0.3 to 3.0 measured based on International Standard ISO5-3 and ISO5-4. If the transmission density exceeds 3.0, the radiation strength in the thickness direction of a recording layer conspicuously lowers as a result of attenuation of the radiation and aberration is liable to occur. When the transmission density is less than 0.3, the absorption of radiation energy is insufficient, and the quantity of heat energy obtained by light/heat conversion is liable to be insufficient.

Of the above-described metallic fine powders, iron powders are preferably used in the radiation-sensitive layer of the present invention. Any iron powders are preferably used, above all, iron alloy powders containing α-Fe as a main component are preferred. These powders may contain, in addition to the prescribed atoms, the following atoms, e.g., Al, Si, S, Sc, Ca, Ti, V, Cr, Cu, Y, Mo, Rh, Pd, Ag, Sn, Sb, Te, Ba, Ta, W, Re, Au, Hg, Pb, Bi, La, Ce, Pr, Nd, P, Co, Mn, Zn, Ni, Sr and B.

In particular, it is preferred to contain at least one of Al, Si, Ca, Y, Ba, La, Nd, Co, Ni and B, in addition to α-Fe, and more preferably at least one of Co, Y and Al is contained in addition to α-Fe. The content of Co is preferably from 0 to 40 atomic %, more preferably from 15 to 35 atomic %, and most preferably from 20 to 35 atomic %, the content of Y is preferably from 1.5 to 12 atomic %, more preferably from 3 to 10 atomic %, and most preferably from 4 to 9 atomic %, the content of Al is preferably from 1.5 to 12 atomic %, more preferably from 3 to 10 atomic %, and most preferably from 4 to 9 atomic %, each based on Fe.

Iron alloy powders may contain a small amount of a hydroxide or an oxide. Specific examples thereof are disclosed in JP-B-44-14090, JP-B-45-18372, JP-B-47-22062, JP-B-47-22513, JP-B-46-28466, JP-B-46-38755, JP-B-47-4286, JP-B-47-12422, JP-B-47-17284, JP-B-47-18509, JP-B-47-18573, JP-B-39-10307, JP-B-46-39639, U.S. Pat. Nos. 3,026,215, 3,031,341, 3,100,194, 3,242,005, and 3,389,014.

More specifically, α-iron alloy fine powders having Fe/Co/Al/Y ratio of 100/20/5/5, a long axis length of 0.1 μm, a short axis length of 0.02 μm, and specific surface area of 60 $m^2/g$ are preferred.

As the example of special light/heat converting substance in the radiation-sensitive layer of the present invention, silver fine particles dispersed in a binder can be exemplified. Preferred silver fine particle dispersions are colloidal silver fine particles for use in a yellow filter for color photographic materials for photographing and silver fine particle dispersions of neutral colors for use for antihalation.

The former can be obtained by reducing water-soluble silver salts such as silver nitrate with starch, glucose, hydroquinone, formaldehyde or dextrin in aqueous media using polymers such as cellulose derivatives, e.g., gelatin or carboxymethyl cellulose, and hydrophilic high polymers, e.g., polyvinyl pyrrolidone, as a dispersion medius. The latter can also be obtained by almost the same method as above using a reducing agent such as hydroquinone or p-aminophenol derivatives under more active condition. At that time, it is possible to increase absorbance by adding a color toner such as 1-mercaptobenzimidazole or 6-nitroindazole.

In addition, silver fine particle dispersions may be obtained by adding a photographic developing solution to silver halide emulsion particles.

Silver fine particles preferably have a particle size of from 0.01 to 10 μm. The finer the particles, the higher is the absorbance, but more preferred particle size is from 0.02 to 1 μm because the absorption in spectral wavelength region of infrared ray lowers as the particle size becomes finer. The particle size of colloidal silver fine particles for use in a yellow filter is from 0.02 to 0.06 μm, the particle size of silver fine particle dispersions of neutral colors for use for antihalation is from 0.05 to 0.2 μm, and the particle size of silver fine particles obtained by reducing a silver halide emulsion is from 0.1 to 2.0 μm. These particle sizes suffice for infrared absorbers.

These dyes, pigments, metallic powders or metallic compound powders are added in an amount of from 0.01 to 50 wt %, preferably from 0.1 to 10 wt %, based on the total solid contents of the composition of the radiation-sensitive layer of the present invention. The content of the dyes is particularly preferably from 0.5 to 10 wt %, that of the pigments is particularly preferably from 1.0 to 10 wt %, and the content of the metallic powders or metallic compound powders is particularly preferably from 0.2 to 3 wt %. When the addition amount of the dyes, pigments, metallic powders or metallic compound powders is less than 0.01 wt %, the sensitivity is reduced, while when it exceeds 50 wt %, scumming is liable to occur in nonimage area at printing.

Other Components

The above-described components are added to the radiation-sensitive layer of the present invention as required, and various other compounds may further be added besides these compounds according to necessity. For example, dyes having large absorption in visible ray region can be used as colorants of images.

Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the dyes disclosed in JP-A-62-293247 and JP-A-9-179290 can be exemplified.

These dyes are added in an amount of from 0.01 to 10 wt % based on the entire solid contents of the recording layer of the lithographic printing plate precursor according to the present invention.

Nonionic surfactants as disclosed in JP-A-62-251740 and JP-A-3-208514 and ampholytic surfactants as disclosed in JP-A-59-121044 and JP-A-4-13149 can be added to the radiation-sensitive layer of the present invention for widening the stability to printing conditions.

Specific examples of nonionic surfactants include sorbitan tristearate, sorbitan monopalmitate, sorbitan trioleate, stearic acid monoglyceride, polyoxyethylene-nonylphenyl ether, etc.

Specific examples of ampholytic surfactants include alkyldi(aminoethyl)glycine, alkylpolyaminoethylglycine hydrochloride, 2-alkyl-N-carboxyethyl-N-hydroxyethyl-imidazolinium betaine, N-tetradecyl-N,N-betaine type surfactants (e.g., Amogen K, trade name, manufactured by Daiichi Kogyo Seiyaku Co., Ltd.), etc.

The ratio of the content of these nonionic and ampholytic surfactants in the total solid contents of the radiation-sensitive layer is preferably from 0.05 to 15 wt %, more preferably from 0.1 to 5 wt %.

Plasticizers are added to the radiation-sensitive layer of the present invention for improving the flexibility of the film, if necessary, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, etc., can be used.

The radiation-sensitive layer on the imaging plate cylinder according to the present invention can be manufactured generally by dissolving the above-described each component in a solvent and coating the resulting coating solution on the imaging plate cylinder. Examples of the solvents used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulforan, γ-butyrolactone, toluene, water, etc., but solvents are not limited thereto.

These solvents are used alone or as mixture. The concentration of the above constitutional components of the radiation-sensitive layer (total solid contents inclusive of the additives) in a solvent is preferably from 1 to 50 wt %. The radiation-sensitive layer is preferably coated and dried. Various coating methods can be used, e.g., bar coating, rotary coating, spray coating, curtain coating, dip coating, air knife coating, blade coating, and roll coating can be used.

Surfactants, e.g., fluorine surfactants disclosed in JP-A-62-170950, can be added to the radiation-sensitive layer for improving the coating property. The addition amount is preferably from 0.01 to 1 wt %, more preferably from 0.05 to 0.5 wt %, based on the entire solid contents of the recording layer of the lithographic printing plate precursor.

The radiation-sensitive layer for the lithographic printing plate of the present invention can be produced as described above. This lithographic printing plate precursor is subjected to direct imagewise heat-sensitive recording by a thermal recording head, or image exposure with a solid state laser or a semiconductor laser emitting infrared rays of the wavelength of from 760 to 1,200 nm. In the present invention, the printing plate precursor undergoes development with water after heat-sensitive recording or laser irradiation and, if necessary, further subjected to gumming treatment. The thus-obtained printing plate is mounted on a printing machine and printing is effected. Alternatively, the printing plate may be mounted on a printing machine to perform printing immediately after heat-sensitive recording or laser irradiation. It is preferred in both cases to perform heat treatment after heat-sensitive recording or laser irradiation. Heating is preferably performed at 80 to 150° C. for 10 seconds to 5 minutes. By performing this heat treatment, the heat or laser energy required for recording can be reduced at the time of heat-sensitive recording or laser irradiation.

The radiation-sensitive layer for the lithographic printing plate having undergone image-recording and post-treatment is subjected to water development or loaded on an offset printing machine as it is and used for printing a lot of sheets.

However, when the polymer contained in the radiation-sensitive layer has a carboxylic acid group, the water and the fountain solution for use in water development should have a pH value of from 7 to 10. This range of pH value is more alkaline than the developing solutions used for general PS plates and causes no environmental problem. Further, when a polymer having a carboxylate group is used, general city water can be sufficiently used as the water and fountain solution for water development.

Prior to the Examples, schemes of several routes forming water-insoluble structures using polymers crosslinked by a sol/gel reaction of an example of the present invention are exemplified below.

1 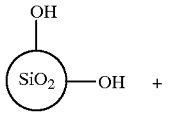

silicic anhydride

-continued

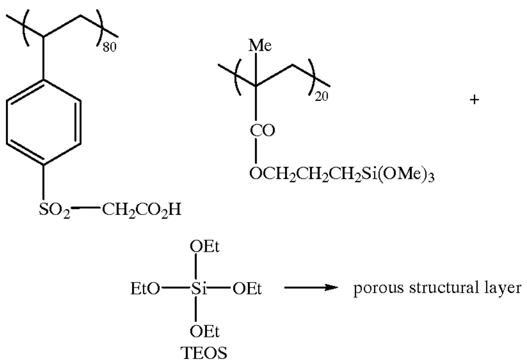

2 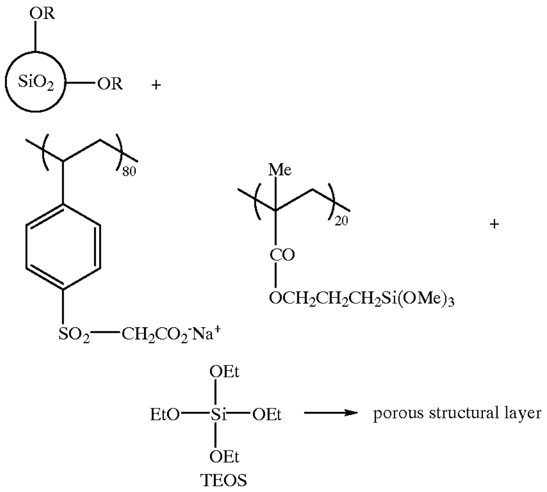

3 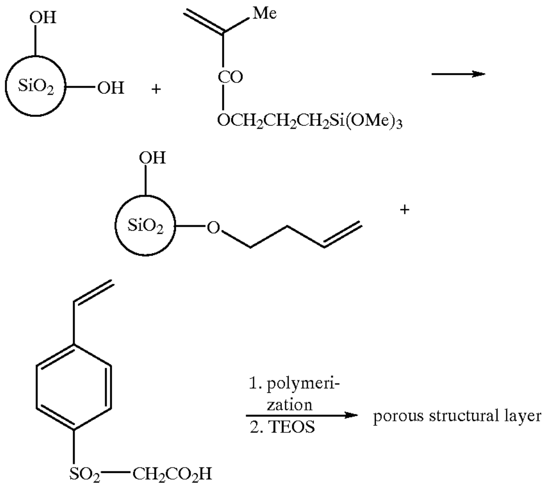

4 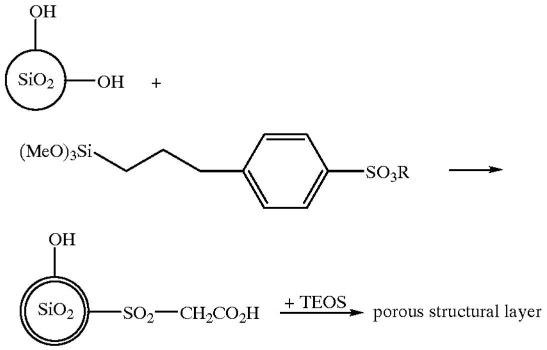

-continued

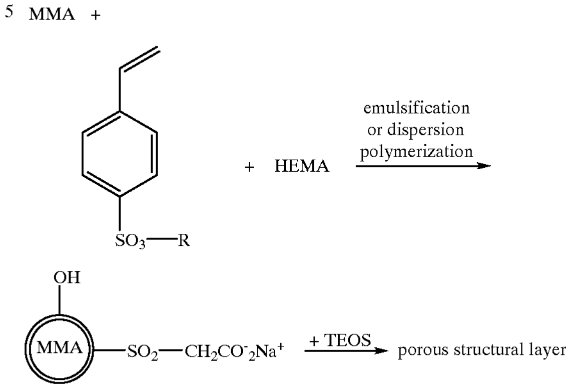

Note MMA: methyl methacrylate, HEMA: hydroxyethyl methacrylate

In the above drawings, schemes 1 and 2 are examples of forming porous structural layers in the presence of compound (i), compound (ii) and solid particles (iii) simultaneously. Scheme 1 is the case of using silica particles as solid particles (iii), and scheme 2 is the case of using silica particles surface-modified in advance as solid particles (iii). Further, R in the drawings means a substituent such as a modifying group of each compound and solid, and R may differ from each other according to cases.

Schemes 3 and 4 are examples in which a silane coupling agent [compound (ii)] is applied to the silica particles in advance and then reactions to generate porous structures are performed by adding compound (ii), which may be different, and in scheme 3 particle surfaces are modified with a polymerizable monomer.

In scheme 5, organic polymer particles are formed in the first place by emulsification or dispersion polymerization.

More specifically, in scheme 3, particle surfaces having a polymerizable group are formed using a silane coupling agent of compound (ii), then a compound having the above-described functional group (a) and particles having the functional group (a) are formed, and then porous structure is formed using compound (ii).

In scheme 4, the functional group (a)-containing particles are directly formed using a silane coupling agent and then porous structure is formed using compound (ii).

The present invention can take any of the above modes, but the present invention is not limited thereto.

EXAMPLE

The present invention is described in detail with referring to examples, but the present invention is not construed as being limited thereto.

Examples 1 to 4

Four kinds of solutions A were prepared with varying the kind of the polymer of the present invention having a functional group converting from hydrophilic to hydrophobic by heat as shown in Table 1 below. Each solution was coated on the surface of imaging plate cylinder on the printing machine and the coated solution was dried by heating at 100° C. for 5 minutes with a laser emitting infrared rays from an imaging unit equipped adjacent to the imaging plate cylinder to effect crosslinking.

Solutions A was prepared as Comparative Example 1 in the same manner as in Examples 1 to 4 except for using the polarity converting polymer (R-1) described in JP-A-9-99535 disclosing the above-described lithographic printing machine of direct imaging on printing machine, and tetrahydropyranyl modified methyl acrylate manufactured by 3M Corporation, Minn., U.S.A.

| Solution A | |
|---|---|
| Polymer of the present invention (shown in Table 1) | 6.0 g |
| Phthalic anhydride | 0.05 g |
| o-Chlorophenol | 0.01 g |
| Infrared absorber (specific dye A shown below) | 0.6 g |
| Water | 20 g |
| Acetonitrile | 20 g |

TABLE 1

| | | | Printing Property | |
|---|---|---|---|---|
| Example | Polymer of the Present Invention | Sensitizer (photo-initiator) | Scumming in Nonimage area (6,000 sheets) | Ink Adhesion in Nonimage Area (6,000 sheets) |
| 1 | (I-4) | — | None | Good |
| 2 | (I-12) | — | None | Good |
| 3 | (I-19) | — | None | Good |
| 4 | (I-21) | — | None | Good |
| 5 | (KP-4) | DMAB* | None | Good |
| 6 | (KP-13) | DMAB | None | Good |
| 7 | (KP-14) | Formula 1 below | None | Good |
| 8 | (KP-15) | DMAB | None | Good |
| Comparative Example 1 | 3M, Polarity converting polymer (R-1) | — | A little | Good |

*DMAB: 4, 4'-Dimethylaminobenzophenone

Formula 1

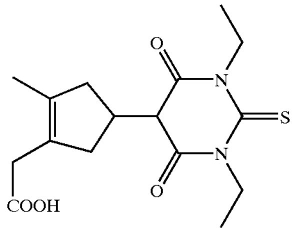

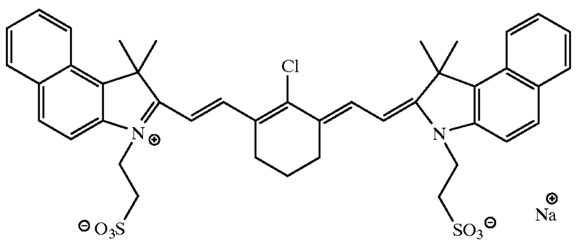

Specific Dye A

Examples 5 to 8

Four kinds of solutions B were prepared with varying the kind of the polymer of the present invention as shown in Table 1 above. Each solution was coated on the surface of imaging plate cylinder on the printing machine and the coated solution was irradiated with a laser emitting ultraviolet rays equipped contiguously to the imaging plate cylinder for 1 minute and drying was performed at 80° C. for 2 minutes to effect crosslinking.

| Solution B | |
|---|---|
| Polymer of the present invention (shown in Table 1) | 6.0 g |
| Sensitizer (photoinitiator, shown in Table 1) | 0.6 g |
| Infrared absorber (specific dye A shown above) | 0.6 g |
| Water | 20.0 g |
| Acetonitrile | 20.0 g |

Creo Thermal Head manufactured by Creo Products Inc., Canada, was used as imaging head, which was 240 channel laser head with the output of 18 W. Imaging sensitivity for the printing operation of the printing amount of 50,000 sheets or more was 0.2 J/cm$^2$, imaging time required for a sheet having the area of 80 cm×100 cm (perimeter: 80 cm, length: 100 cm) was about 2 minutes. The resolution was 2,400 DPI, data transmission rate was about 15 MB/sec. The engine speed (number of revolutions) of the imaging drum during imaging was about 300 rpm.

Imaging was performed using the above imaging unit on the above conditions and printing was carried out with no development processing.

Scumming after printing 6,000 sheets was visually evaluated. The results obtained are shown in Table 1 above.

Every printing plate on the imaging plate cylinder in each Example according to the present invention could provide more than 6,000 sheets of clear printed matters having no scumming in the nonimage area, and so satisfactory results could be obtained.

As described above, according to the lithographic printing machine and lithographic printing method of the present invention, a thin layer of a polymer compound having a functional group which is converted from hydrophilic to hydrophobic by heating or by heat generated by light/heat conversion is formed as a radiation-sensitive material on the surface of the imaging plate cylinder of the printing machine by means of a film-coating unit equipped contiguously to the imaging plate cylinder and a film-hardening unit. By recording images with a solid state laser or a thermal head emitting infrared rays equipped in the imaging unit, it is possible to perform plate-making directly from digital data.

Moreover, the hydrophilic/hydrophobic property of the radiation-sensitive layer (image-forming layer) according to the present invention is largely converted by scanning exposure of images with laser beams for short time and polarity conversion property is exhibited. As a result, the discrimination to ink is exhibited, thereby an image area is formed. Thus, according to the present invention, a printing plate capable of providing printed matters not generating scumming can be made directly on machine without requiring special processes such as wet development or rubbing after image exposure even under severe printing conditions.

What is claimed is:

1. A lithographic printing method on a lithographic printing machine comprising a plate cylinder for imaging, a blanket cylinder, an impression cylinder, and a film-coating unit, a film-hardening unit, an imaging unit and a cleaning unit, each unit of which is adjacent to the plate cylinder for imaging, which comprises the steps of at least (a) cleaning operation of cleaning said plate cylinder for imaging, (b) coating operation of coating a radiation-sensitive image-forming layer containing a polymer having a functional group which converts from hydrophilic to hydrophobic by heating on the surface of said plate cylinder for imaging, (c) hardening operation of hardening said image-forming layer to a solid state, and (d) surface conversion operation of forming an image pattern due to hydrophilic/hydrophobic conversion corresponding to the digital data to be printed on the surface of said image-forming layer wherein said functional group which is converted from hydrophilic to hydrophobic is selected from the group consisting of a carboxylic acid group and a carboxylate group, and wherein the conversion from hydrophilic to hydrophobic occurs by decarboxylation.

2. The lithographic printing method as claimed in claim 1, wherein said plate cylinder is a seamless cylinder.

3. The lithographic printing method as claimed in claim 1, wherein lithographic printing is conducted without wet development or rubbing.

4. A lithographic printing method on a lithographic printing machine comprising a plate cylinder for imaging, a blanket cylinder, an impression cylinder, and a film-coating unit, a film-hardening unit, an imaging unit and a cleaning unit, each unit of which is adjacent to the plate cylinder for imaging, which comprises the steps of at least (a) cleaning operation of cleaning said plate cylinder for imaging, (b) coating operation of coating a radiation-sensitive image-forming layer containing a polymer having a functional group which converts from hydrophilic to hydrophobic by heating on the surface of said plate cylinder for imaging, (c) hardening operation of hardening said image-forming layer to a solid state, and (d) surface conversion operation of forming an image pattern due to hydrophilic/hydrophobic conversion corresponding to the digital data to be printed on the surface of said image-forming layer wherein said functional group which is converted from hydrophilic to hydrophobic by the heat is represented by the following formula (1) or (2):

(1)

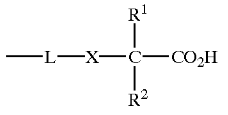

(2)

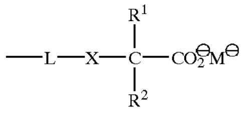

wherein X is selected from —CO—, —SO—, —$SO_2$—, and elements belonging to Group 15 and Group 16 of the Periodic Table; —L— represents a divalent connecting group; $R^1$ and $R^2$, which may be the same or different, each represents a monovalent group; and M represents a cation selected from the group consisting of an alkali metal, an alkaline earth metal and onium, and wherein the conversion from hydrophilic to hydrophobic occurs by decarboxylation.

5. The lithographic printing method as claimed in claim 4, wherein said plate cylinder is a seamless cylinder.

6. The lithographic printing method as claimed in claim 4, wherein lithographic printing is conducted without wet development or rubbing.

7. A lithographic printing machine comprising a plate cylinder for imaging, a blanket cylinder, an impression cylinder, and a film-coating unit, a film-hardening unit, an imaging unit and a cleaning unit, each unit of which is adjacent to the plate cylinder for imaging, wherein an image-forming layer containing a polymer having a functional group which is crosslinked by light or heat before imaging and a functional group which is converted from hydrophilic to hydrophobic by the heat generated by infrared ray irradiation is formed by said film-coating unit wherein said functional group which is converted from hydrophilic to hydrophobic is selected from the group consisting of a carboxylic acid group and a carboxylate group, and wherein the conversion from hydrophilic to hydrophobic occurs by decarboxylation.

8. The lithographic printing machine as claimed in claim 7, wherein said plate cylinder is a seamless cylinder.

9. A lithographic printing machine comprising a plate cylinder for imaging, a blanket cylinder, an impression cylinder, and a film-coating unit, a film-hardening unit, an imaging unit and a cleaning unit, each unit of which is adjacent to the plate cylinder for imaging, wherein an image-forming layer containing a polymer having a functional group which is crosslinked by light or heat before imaging and a functional group which is converted from hydrophilic to hydrophobic by the heat generated by infrared ray irradiation is formed by said coating unit wherein said functional group which is converted from hydrophilic to hydrophobic by the heat is represented by the following formula (1) or (2):

(1)

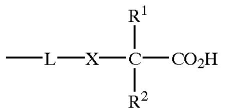

(2)

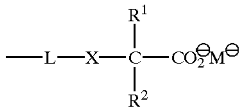

wherein X is selected from —CO—, —SO—, —$SO_2$—, and elements belonging to Group 15 and Group 16 of the Periodic Table; —L— represents a divalent connecting group; $R^1$ and $R^2$, which may be the same or different, each represents a monovalent group; and M represents a cation selected from the group consisting of an alkali metal, an alkaline earth metal and onium, and wherein the conversion from hydrophilic to hydrophobic occurs by decarboxylation.

10. The lithographic printing machine as claimed in claim 9, wherein said plate cylinder is a seamless cylinder.

* * * * *